United States Patent
Takao et al.

(10) Patent No.: US 10,041,595 B2
(45) Date of Patent: Aug. 7, 2018

(54) SEAL STRUCTURE

(75) Inventors: Yuki Takao, Fujisawa (JP); Kuniaki Miyake, Tokyo (JP); Shinya Nakaoka, Makinohara (JP); Noriyuki Shinbo, Fukushima (JP)

(73) Assignee: NOK Corporation (JP)

( * ) Notice: Subject to any disclaimer, the term of this patent is extended or adjusted under 35 U.S.C. 154(b) by 469 days.

(21) Appl. No.: 14/349,889

(22) PCT Filed: Mar. 13, 2012

(86) PCT No.: PCT/JP2012/056337
§ 371 (c)(1),
(2), (4) Date: Apr. 4, 2014

(87) PCT Pub. No.: WO2013/051301
PCT Pub. Date: Apr. 11, 2013

(65) Prior Publication Data
US 2014/0252722 A1    Sep. 11, 2014

(30) Foreign Application Priority Data

Oct. 6, 2011  (JP) ................... 2011-221943
Oct. 6, 2011  (JP) ................... 2011-221944
Oct. 6, 2011  (JP) ................... 2011-221945

(51) Int. Cl.
    *F16J 15/14*    (2006.01)
    *F16J 15/08*    (2006.01)
    (Continued)

(52) U.S. Cl.
    CPC ............ *F16J 15/08* (2013.01); *F16J 15/062* (2013.01); *F16J 15/0818* (2013.01);
    (Continued)

(58) Field of Classification Search
    CPC ........ F16J 15/08; F16J 15/062; F16J 15/0818; F16J 2015/085; F16J 2015/2856; H02G 3/088; H05K 5/061; H05K 5/069
    (Continued)

(56) References Cited

U.S. PATENT DOCUMENTS

2008/0246232 A1*  10/2008  Takahashi .............. F16J 15/122
                                                              277/651
2009/0149048 A1*   6/2009  Pavlovic ............... B60L 3/0069
                                                              439/181

FOREIGN PATENT DOCUMENTS

JP    S61-023713 Y2    7/1986
JP    S61-023714 Y2    7/1986
(Continued)

OTHER PUBLICATIONS

Generate—deficnition by The Free Dictionary.*
(Continued)

*Primary Examiner* — Nathan Cumar
(74) *Attorney, Agent, or Firm* — Harness, Dickey & Pierce, P.L.C.

(57) ABSTRACT

In order to prevent gaps from occurring in corner sections in a section where three surfaces are joined together, comprising the combination of a housing, grommet and cover, or the like, thereby improve sealing, a seal structure, which is provided with a housing in which a notch-shaped grommet-mounting section is disposed, a grommet, a cover and a metal substrate gasket, is provided, wherein the grommet is provided with a seal projection, and the seal projection forms a protruding section due to a portion of the seal projection protruding toward the metal substrate gasket when the seal projection makes intimate contact with the inner surface of the grommet-mounting section. The metal substrate gasket is provided with two seal lines and a groove-shaped recess between the seal lines. When nipped, (Continued)

the protruding section of the seal projection is tightly compressed inside the groove-shaped recess in the metal substrate gasket.

1 Claim, 20 Drawing Sheets

(51) Int. Cl.
    *F16J 15/06*     (2006.01)
    *H05K 5/06*     (2006.01)
    *H02G 3/08*     (2006.01)

(52) U.S. Cl.
    CPC ............. *H02G 3/088* (2013.01); *H05K 5/061* (2013.01); *H05K 5/069* (2013.01); *F16J 2015/085* (2013.01); *F16J 2015/0856* (2013.01)

(58) Field of Classification Search
    USPC ........................................ 277/590, 650, 653
    See application file for complete search history.

(56) References Cited

FOREIGN PATENT DOCUMENTS

| JP | H02-241956 A | 9/1990 |
|----|----|----|
| JP | H09-222176 A | 8/1997 |
| JP | 2002-369346 A | 12/2002 |
| JP | 2004-072877 A | 3/2004 |
| JP | 2006-129545 A | 5/2006 |
| JP | 2006129545 * | 5/2006 |
| JP | 2009-093903 A | 4/2009 |
| JP | 2009-153264 A | 7/2009 |

OTHER PUBLICATIONS

International Search Report (in Japanese and English) for PCT/JP2012/056337, dated Apr. 17, 2012; ISA/JP.
International Preliminary Report on Patentability Chapter II (in Japanese and English) for PCT/JP2012/056337, dated Aug. 15, 2013; IPEA/JP.

\* cited by examiner

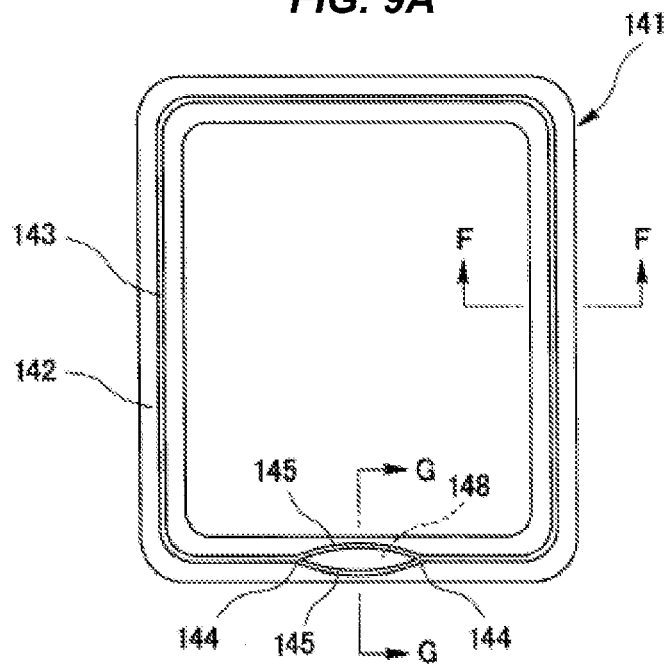
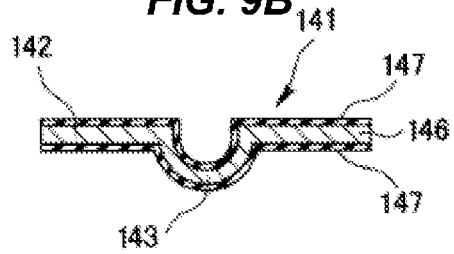 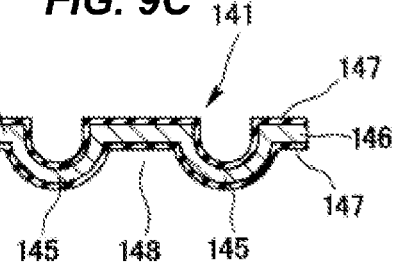
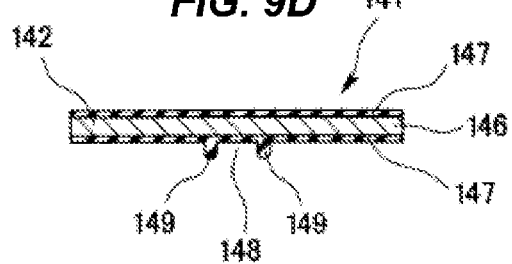

FIG. 17A
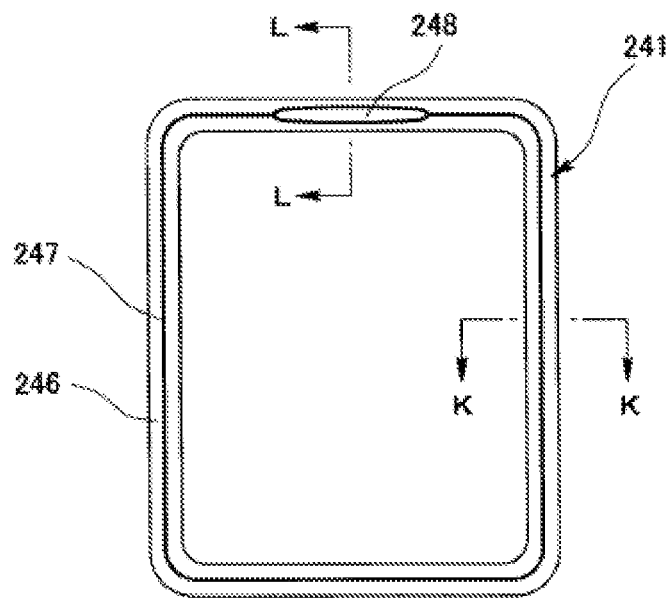
FIG. 17B     FIG. 17C
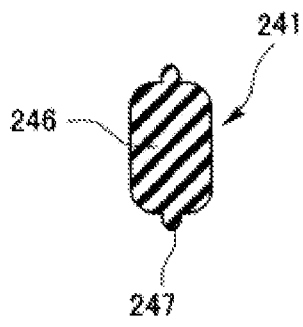 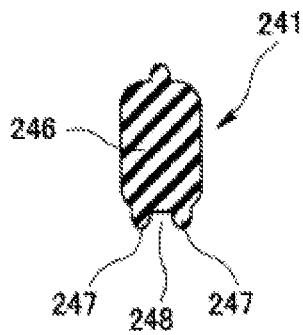

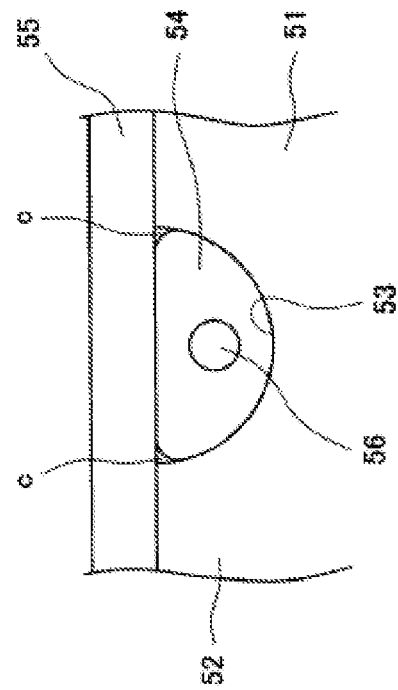
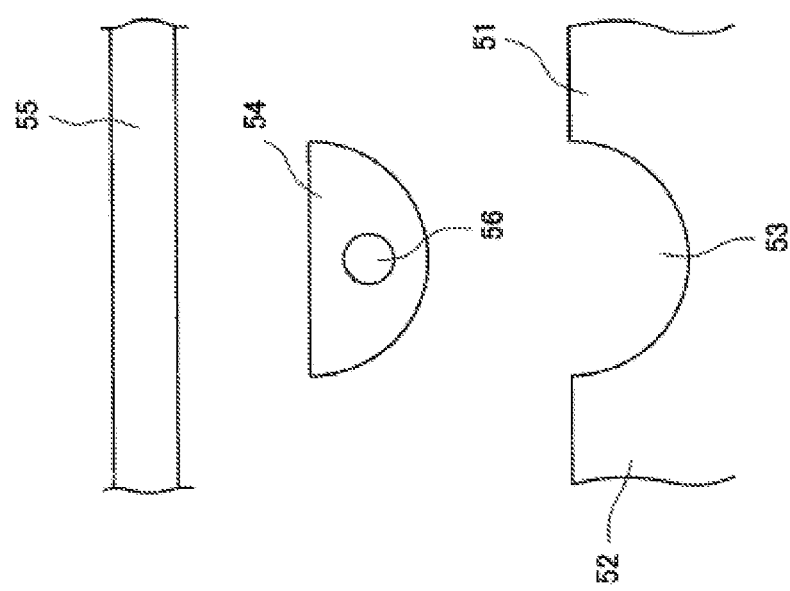
FIG. 20A
FIG. 20B

SEAL STRUCTURE

CROSS-REFERENCE TO RELATED APPLICATIONS

This application is a U.S. National Stage Application of International Application No. PCT/JP2012/056337, filed on Mar. 13, 2012, and published in Japanese as WO 2013/051301 A1 on Apr. 11, 2013. This application claims priority to Japanese Application Nos. 2011-221943, 2011-221944 and 2011-221945, all of which were filed on Oct. 6, 2011. The disclosures of the above applications are incorporated herein by reference.

BACKGROUND OF THE INVENTION

Field of the Invention

The present invention relates to a seal structure according to a sealing technique. The seal structure according to the present invention is used for sealing a section where three surfaces are joined together, for example, in an electric equipment device and an engine.

Description of the Conventional Art

In the electric equipment device such as an electronically controlled unit, a power control unit or a DC-DC converter for an electric vehicle or a hybrid vehicle, a grommet is installed to a casing for sealing an insertion port of a harness or a piping which is connected to an external portion (refer to Japanese Unexamined Patent Publication Nos. 2002-369346, 2004-72877 and 2009-153264).

In other words, FIG. 20A is an explanatory view showing a typical conventional example. A notch-like grommet installation portion 53 is provided in a wall portion 52 of a casing 51, and a cover 55 is put on the casing 51 and a grommet 54 in a state in which the grommet 54 is installed to the grommet installation portion 53, whereby an insertion port of the harness or the piping is sealed. A through hole 56 for inserting the harness or the piping is provided in the grommet 54.

In this case, the grommet 54 achieves a sealing action by being pinched and compressed between the casing 51 and the cover 55, however, a gap c tends to be generated in a corner portion in a position where respective surfaces of the casing 51, the grommet 54 and the cover 55 intersect (a section where three surfaces are joined together) as shown in FIG. 20B due to a problem on a shape of the grommet 54. Accordingly, there is a case that a seal leakage generates a problem.

Further, the problem of the seal leakage due to the intersection among three members also exists in a connecting position between a cylinder portion of the engine and various covers (refer to Japanese Utility Model Publication Nos. 61-23713 and 61-23714, and Japanese Unexamined Patent Publication No. 2-241956).

Further, there has been proposed a structure which intends to reduce the gap c by arranging a seal projection in a thick surface (a side surface or an upper surface) of the grommet 54, as a prior art, however, there is a case that the gap c can not be done away only by arranging the seal projection as mentioned above, and it is an insufficient countermeasure.

SUMMARY OF THE INVENTION

Problem to be Solved by the Invention

The present invention is made by taking the above points into consideration, and an object of the present invention is to provide a seal structure which can inhibit a gap from being generated at a corner portion in a section where three surfaces are joined together, the section being constructed by a combination of a casing, a grommet and a cover, whereby it is possible to improve a sealing performance.

Means for Solving the Problem

In order to achieve the object, a seal structure according to a first aspect of the present invention is a seal structure comprising a casing which is provided in its wall portion with a notch-like grommet installation portion, a grommet which is installed to the grommet installation portion, a cover which is put on the wall portion and the grommet, and a metal base plate gasket which is installed between the wall portion and the grommet, and the cover, wherein the grommet is provided with a seal projection at least on a surface which faces to an inner surface of the grommet installation portion, the seal projection seals between the wall portion and the grommet by coming into close contact with the inner surface of the grommet installation portion, and is provided with a protruding portion generated by a protrusion of a part of the seal projection toward the metal base plate gasket in the case that the seal projection comes into close contact with the inner surface of the grommet installation portion, the metal base plate gasket is provided with two seal lines which are parallel to each other on a surface facing to the wall portion, and is provided with two seal lines which are continuously provided from the seal lines on a surface facing to the grommet, and is further provided with a groove-like concave portion between the two seal lines, and the protruding portion in the seal projection is closely compressed within the groove-like concave portion in the metal base plate gasket.

Further, a seal structure according to a second aspect of the present invention is the seal structure described in the first aspect mentioned above, wherein the grommet installation portion is provided with a chamfer portion in an edge portion in its inner surface, and the seal projection is formed such a shape that a cross sectional shape of a position facing to the chamfer portion is enlarged little by little in correspondence to the shape of the chamfer portion.

Further, a seal structure according to a third aspect of the present invention is a seal structure comprising a casing which is provided in its wall portion with a notch-like grommet installation portion, a grommet which is installed to the grommet installation portion, a cover which is put on the wall portion and the grommet, and a metal base plate gasket which is installed between the wall portion and the grommet, and the cover, wherein the grommet is provided with a seal projection at least on a surface which faces to an inner surface of the grommet installation portion, the seal projection seals between the wall portion and the grommet by coming into close contact with the inner surface of the grommet installation portion, and is provided with a protruding portion generated by a protrusion of a part of the seal projection toward the metal base plate gasket in the case that the seal projection comes into close contact with the inner surface of the grommet installation portion, the metal base plate gasket is provided with one seal line and a branch portion in which the seal line is branched into two lines, and is provided with two seal lines which are continuously provided from the branch portion on a surface facing to the grommet, and is further provided with a concave portion which is surrounded by the branch portion and the two seal lines, and the protruding portion in the seal projection is closely compressed in an inner side of the branch portion within the concave portion in the metal base plate gasket.

Further, a seal structure according to a fourth aspect of the present invention is the seal structure described in the third aspect mentioned above, wherein the grommet installation portion is provided with a chamfer portion in an edge portion in its inner surface, and the seal projection is formed such a shape that a cross sectional shape of a position facing to the chamfer portion is enlarged little by little in correspondence to the shape of the chamfer portion.

Further, a seal structure according to a fifth aspect of the present invention is a seal structure comprising a casing which is provided in its wall portion with a notch-like grommet installation portion, a grommet which is installed to the grommet installation portion, a cover which is put on the wall portion and the grommet, and a rubber single body gasket which is installed between the wall portion and the grommet, and the cover, wherein the grommet is provided with a seal projection at least on a surface which faces to an inner surface of the grommet installation portion, the seal projection seals between the wall portion and the grommet by coming into close contact with the inner surface of the grommet installation portion, and is provided with a protruding portion generated by a protrusion of a part of the seal projection toward the rubber single body gasket in the case that the seal projection comes into close contact with the inner surface of the grommet installation portion, and the rubber single body gasket is provided with one seal line and a branch portion in which the seal line is branched into two lines, and is provided with two seal lines which are continuously provided from the branch portion on a surface facing to the grommet, and is further provided with a space portion or a concave portion which is surrounded by the branch portion and the two seal lines, and the protruding portion in the seal projection is closely compressed in an inner side of the branch portion within the space portion or the concave portion in the rubber single body gasket.

Further, a seal structure according to a sixth aspect of the present invention is the seal structure described in the fifth aspect mentioned above, wherein the rubber single body gasket is installed to a gasket installation groove which is provided in the cover.

In the seal structure according to the first aspect of the present invention having the structure mentioned above, the metal base plate gasket is added to the combination of the casing, the grommet and the cover, and the metal base plate gasket is installed between the wall portion of the casing and the grommet, and the cover. The casing is provided in its wall portion with the notch-like grommet installation portion. The grommet is provided with the seal projection on the surface facing to the inner surface of the grommet installation portion. The seal projection seals between the wall portion and the grommet by coming into close contact with the inner surface of the grommet installation portion, and forms the protruding portion by the protrusion of a part of the seal projection toward the metal base plate gasket in the case that the seal projection comes into close contact with the inner surface of the grommet installation portion. On the other hand, the metal base plate gasket is provided with two seal lines which are parallel to each other on the surface facing to the wall portion in the longitudinal direction, and is further provided with the groove-like concave portion between the two seal lines. Further, in the case that the cover is put on the casing and the seal structure is fastened by the pinching means such as a bolt fastening, the metal base plate gasket and the grommet are crushed, and the protruding portion in the seal projection is closely compressed within the groove-like concave portion in the metal base plate gasket.

In the case that the metal base plate gasket is not installed, the protruding portion is compressed between the wall portion of the casing and the grommet, and the cover. In this case, since the protruding portion is not surrounded its periphery by the other members, the protruding portion is deformed so as to crush flatly (deformed in a state in which an escaping direction is not restricted). On the contrary, in the present invention, the protruding portion is deformed in a state in which the protruding portion is pinched by two seal lines in the metal base plate gasket and is surrounded by the inner surface of the groove-like concave portion (deformed in a state in which the escaping direction is restricted). Therefore, since the protruding portion is deformed space, the protruding portion comes into close contact with the inner surface of the groove-like concave portion by being compressed. Accordingly, it is possible to effectively inhibit a gap from being formed.

The casing and the grommet are sealed therebetween by the seal projection. The grommet and the metal base plate gasket, the casing and the metal base plate gasket, and the metal base plate gasket and the cover are respectively sealed therebetween by the close contact of them on the basis of the pinching.

The metal base plate gasket employs, for example, a structure in which one full bead having a circular arc shaped cross section is provided in a flat base plate portion, and the metal base plate gasket is installed so as to direct a bulge obtained by the full bead toward the cover. Accordingly, in this case, two seal lines are formed by both end portions of the bead circular arc, and the groove-like concave portion is formed by a depression in the inner side of the bead circular arc.

The seal projection provided in the grommet forms the protruding portion since the seal projection is compression deformed in the case that the seal projection comes into close contact with the inner surface of the grommet installation portion, thereby protruding toward the metal base plate gasket. Therefore, a sufficient cubic volume (volume) to protrude in the case of being compression deformed is necessary for the seal projection. In this regard, in the case that a cross sectional shape of the seal projection is uniform over a whole length, a distance between the grommet and the wall portion is enlarged in the case that the chamber portion is provided in the edge portion of the inner surface in the grommet installation portion. Therefore, the cubic volume of the seal projection is insufficient, that is, a compression amount is insufficient, so that there is fear that a sealing performance of the portion is hard to be secured or the protruding portion is hard to be formed. In order to devise a countermeasure, it is preferable to form a cross sectional shape (a cross sectional area) of the position facing to the chamfer portion in the seal projection as a shape which is enlarged little by little in correspondence to the shape of the chamfer portion, whereby the facing position is sufficiently compressed by the chamfer portion. According to this structure, even in the case that the chamfer portion is provided in the grommet installation portion, it is possible to securely seal between the casing and the grommet, and it is possible to securely form the protruding portion by the seal projection.

In the seal structure according to the third aspect of the present invention having the structure mentioned above, the metal base plate gasket is added to the combination of the casing, the grommet and the cover, and the metal base plate gasket is installed between the wall portion of the casing and the grommet, and the cover. The casing is provided in its wall portion with the notch-like grommet installation portion. The grommet is provided with the seal projection on the surface facing to the inner surface of the grommet installation portion. The seal projection seals between the wall portion and the grommet by coming into close contact with the inner surface of the grommet installation portion, and forms the protruding portion by the protrusion of a part of the seal projection toward the metal base plate gasket in the case that the seal projection comes into close contact with the inner surface of the grommet installation portion. On the other hand, the metal base plate gasket is provided with one seal line and the branch portion in which the one seal line is branched into two lines on the surface facing to the wall portion in the longitudinal direction, and is provided with two seal lines which are continuously provided from the branch portion on the surface facing to the grommet, and is further provided with the concave portion which is surrounded by the branch portion and two seal lines. Further, in the case that the cover is put on the casing and the seal structure is fastened by the pinching means such as a bolt fastening, the metal base plate gasket and the grommet are crushed, and the protruding portion in the seal projection is closely compressed within the groove-like concave portion in the metal base plate gasket.

In the case that the metal base plate gasket is not installed, the protruding portion is compressed between the wall portion of the casing and the grommet, and the cover. In this case, since the protruding portion is not surrounded its periphery by the other members, the protruding portion is deformed so as to crush flatly (deformed in a state in which an escaping direction is not restricted). On the contrary, in the present invention, the protruding portion is deformed in a state in which the protruding portion is pinched by the branch portion and two seal lines in the metal base plate gasket and is surrounded by the inner surface of the concave portion (deformed in a state in which the escaping direction is restricted). Therefore, since the protruding portion is deformed space, the protruding portion comes into close contact with the inner surface of the concave portion by being compressed. Accordingly, it is possible to effectively inhibit a gap from being formed.

Further, since the present invention is particularly structured such that the branch portion of the seal line is provided in the metal base plate gasket, and the branch portion compresses the protruding portion of the seal projection in its inner side, the bifurcated branch portion presses the protruding portion toward the center in a grommet width direction on the basis of the an application of a pinching force. Therefore, since a reaction force to the pressing (a reaction force directed to an end portion in the grommet width direction) is generated in the protruding portion, it is possible to further effectively inhibit the gap from being formed.

The casing and the grommet are sealed therebetween by the seal projection. The grommet and the metal base plate gasket, the casing and the metal base plate gasket, and the metal base plate gasket and the cover are respectively sealed therebetween by the close contact of them on the basis of the pinching.

The metal base plate gasket employs, for example, a structure in which full beads having a circular arc shaped cross section is provided in a flat base plate portion, more particularly employs a structure in which one full bead and the branch portion in which one full bead is branched into two beads are provided on the surface facing to the wall portion at the installing time in the gasket longitudinal direction, and two full beads which are continuously provided from the branch portion are provided on the surface facing to the grommet, and the metal base plate gasket is installed so as to direct a bulge obtained by each of the full beads and the branch portion toward the wall portion of the casing and the grommet. Accordingly, in this case, the seal lines are formed by the full beads and the top portion of the branch portion, and the concave portion is formed so as to be surrounded by the branch portion and two full beads.

The seal projection provided in the grommet forms the protruding portion since the seal projection is compression deformed in the case that the seal projection comes into close contact with the inner surface of the grommet installation portion, thereby protruding toward the metal base plate gasket. Therefore, a sufficient cubic volume (volume) to protrude in the case of being compression deformed is necessary for the seal projection. In this regard, in the case that a cross sectional shape of the seal projection is uniform over a whole length, a distance between the grommet and the wall portion is enlarged in the case that the chamber portion is provided in the edge portion of the inner surface in the grommet installation portion. Therefore, the cubic volume of the seal projection is insufficient, that is, a compression amount is insufficient, so that there is fear that a sealing performance of the portion is hard to be secured or the protruding portion is hard to be formed. In order to devise a countermeasure, it is preferable to form a cross sectional shape (a cross sectional area) of the position facing to the chamfer portion in the seal projection as a shape which is enlarged little by little in correspondence to the shape of the chamfer portion, whereby the facing position is sufficiently compressed by the chamfer portion. According to this structure, even in the case that the chamfer portion is provided in the grommet installation portion, it is possible to securely seal between the casing and the grommet, and it is possible to securely form the protruding portion by the seal projection.

In the seal structure according to the fifth aspect of the present invention having the structure mentioned above, the rubber single body gasket is added to the combination of the casing, the grommet and the cover, and the rubber single body gasket is installed between the wall portion of the casing and the grommet, and the cover. The rubber single body gasket is made only by a rubber-like elastic material as its name, and is not provided with a metal base plate. Therefore, the rubber single body gasket may be installed to the gasket installation groove provided in the cover for a stable installation. The casing is provided in its wall portion with the notch-like grommet installation portion. The grommet is provided with the seal projection on the surface facing to the inner surface of the grommet installation portion. The seal projection seals between the wall portion and the grommet by coming into close contact with the inner surface of the grommet installation portion, and forms the protruding portion by the protrusion of a part of the seal projection toward the rubber single body gasket in the case that the seal projection comes into close contact with the inner surface of the grommet installation portion. Further, in the case that the cover is put on the casing and the seal structure is fastened by the pinching means such as a bolt fastening, the protruding portion and the rubber single body gasket are both compressed, and the protruding portion strongly comes into close contact with the rubber single body gasket.

The casing and the grommet are sealed therebetween by the seal projection. The grommet and the rubber single body gasket, the casing and the rubber single body gasket, and the rubber single body gasket and the cover are respectively sealed therebetween by the close contact of them on the basis of the pinching.

The rubber single body gasket may be constructed by a tabular gasket in which concavity and convexity are not particularly formed on its flat surface, however, may be structured, for example, such that one seal line and a branch portion in which one seal line is branched into two lines are provided on the surface facing to the wall portion in the gasket longitudinal direction, two seal lines which are continuously provided from the branch portion are provided on the surface facing to the grommet, and a space or a concave portion surrounded by the branch portion and two seal lines is provided. Further, in the case that the rubber single body gasket is formed as mentioned above, the protruding portion is deformed in a state in which the protruding portion is pinched by the branch portion and two seal lines (deformed in a state in which the escaping direction is restricted), that is, deformed within the restricted space. Therefore, the protruding portion comes into close contact with the rubber single body gasket by being compressed. Accordingly, it is possible to effectively inhibit the gap from being formed.

Effect of the Invention

The present invention achieves the following effects.

In other words, in the seal structure according to the first aspect of the present invention, as mentioned above, the seal projection provided in the grommet forms the protruding portion, and the protruding portion is closely compressed within the narrow groove-like concave portion in the metal base plate gasket, whereby it is possible to inhibit the gap from being formed. Therefore, according to the desired object of the present invention, it is possible to inhibit the gap from being generated in the corner portion in the section where three surfaces are joined together, and it is accordingly possible to improve a sealing performance. Further, since the cross sectional shape of the position facing to the chamfer portion in the seal projection is formed such the shape as to be enlarged little by little in correspondence to the shape of the chamfer portion in the case that the chamfer portion is provided in the edge portion in the inner surface in the grommet installation portion, it is possible to securely seal between the casing and the grommet, and it is possible to securely form the protruding portion by the seal projection.

In the seal structure according to the third aspect of the present invention, as mentioned above, the seal projection provided in the grommet forms the protruding portion, and the protruding portion is closely compressed within the narrow concave portion in the metal base plate gasket, whereby it is possible to inhibit the gap from being formed. Further, since the present invention is particularly structured such that the branch portion of the seal line is provided in the metal base plate gasket, and the branch portion compresses the protruding portion of the seal projection in its inner side, the bifurcated branch portion presses the protruding portion toward the center in the grommet width direction on the basis of the application of the pinching force. Accordingly, since the reaction force to the pressing is generated in the protruding portion, it is possible to further effectively inhibit the gap from being formed. Therefore, according to the desired object of the present invention, it is possible to inhibit the gap from being generated in the corner portion in the section where three surfaces are joined together, and it is accordingly possible to improve a sealing performance. Further, since the cross sectional shape of the position facing to the chamfer portion in the seal projection is formed such the shape as to be enlarged little by little in correspondence to the shape of the chamfer portion in the case that the chamfer portion is provided in the edge portion in the inner surface in the grommet installation portion, it is possible to securely seal between the casing and the grommet, and it is possible to securely form the protruding portion by the seal projection.

In the seal structure according to the fifth aspect of the present invention, as mentioned above, the seal projection provided in the grommet forms the protruding portion, and the protruding portion comes into close contact with the rubber single body gasket, whereby it is possible to inhibit the gap from being formed. Therefore, according to the desired object of the present invention, it is possible to inhibit the gap from being generated in the corner portion in the section where three surfaces are joined together, and it is accordingly possible to improve a sealing performance. Further, it is possible to secure a stability of the gasket installation, by installing the rubber single body gasket to the gasket installation groove.

BRIEF EXPLANATION OF THE DRAWINGS

FIG. 9A is a plan view of a metal base plate gasket which is provided in the seal structure;

FIG. 9B is an enlarged cross sectional view of a substantial part of the metal base plate gasket and corresponds to an enlarged cross sectional view along a line F-F in FIG. 9A;

FIG. 9C is an enlarged cross sectional view of a substantial part of the metal base plate gasket and corresponds to an enlarged cross sectional view along a line G-G in FIG. 9A;

FIG. 9D is a cross sectional view of a substantial part and shows the other example of the metal base plate gasket;

FIG. 17A is a bottom elevational view showing the other example of the rubber single body gasket;

FIG. 17B is an enlarged cross sectional view of a substantial part of the rubber single body gasket and corresponds to an enlarged cross sectional view along a line K-K in FIG. 17A;

FIG. 17C is an enlarged cross sectional view of the substantial part of the rubber single body gasket and corresponds to an enlarged cross sectional view along a line L-L in FIG. 17A;

FIG. 20A is a front elevational view showing a state before assembling a seal structure according to the prior art; and FIG. 20B is a front elevational view showing a state after assembling.

DETAILED DESCRIPTION OF PREFERRED EMBODIMENTS

Figure 1:
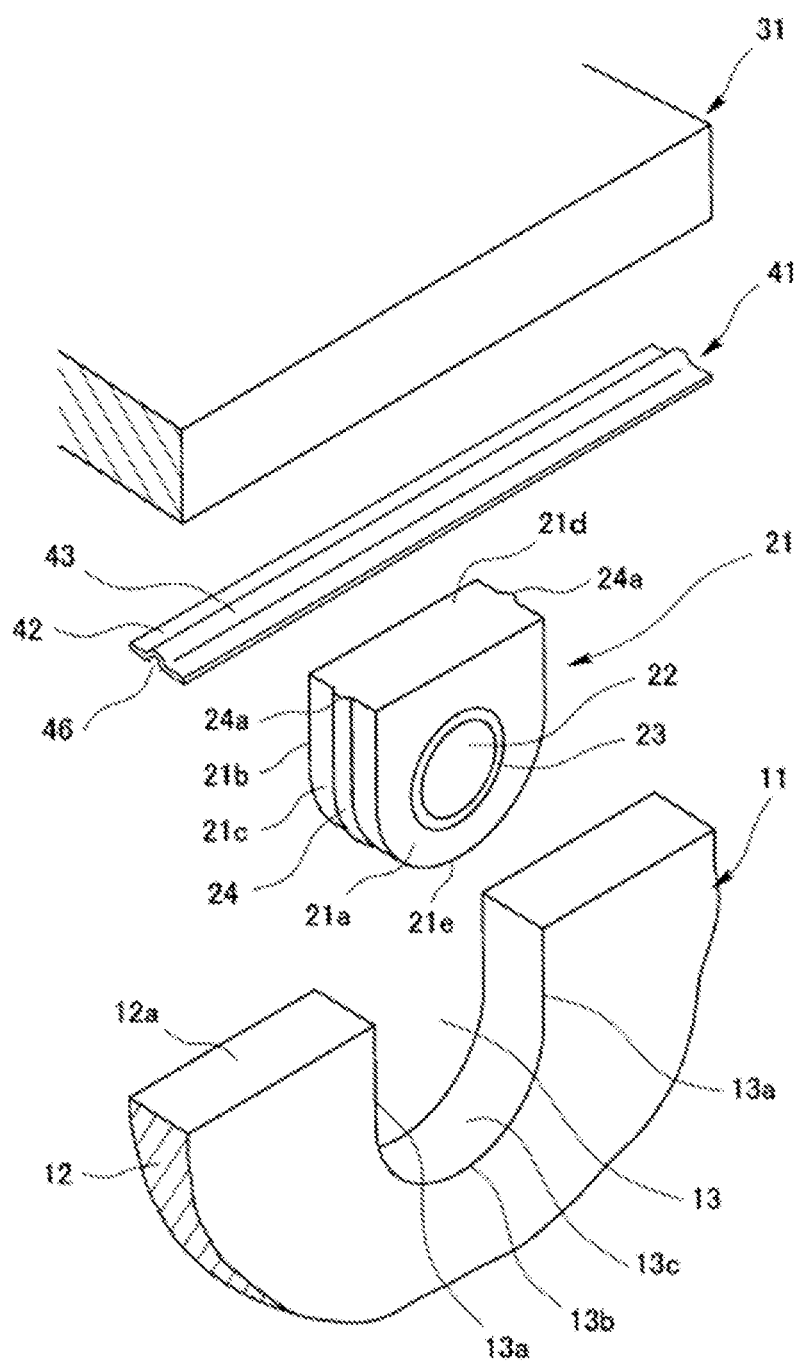
FIG. 1 is a perspective view showing a state before assembling a seal structure according to a first embodiment of the present invention.

The following embodiments are included in the present invention.

Relevant to First Aspect (1) The present invention provides a seal structure in which a cover member is attached to a casing to which a U-shaped grommet is installed from an opening surface side of the casing, via a metal base plate gasket having a bead, wherein a seal projection is provided at least in a grommet side surface which is bonded to the casing, a part of the seal projection is protruded to three surface portions where the casing, the grommet and the cover member are overlapped, the protruding portion is housed in a bead concave portion, and the protruding portion is compression sealed by the gasket at the assembling time.

(2) The seal projection of the protruding grommet is housed in an inner side (a concave portion) of the bead of the gasket, and the protruding portion of the seal projection is compressed by a crushing at the installing time of the gasket bead, thereby carrying out a stable seal of three surface portions.

(3) The surface facing to the cover member of the grommet may be provided with a seal projection which is housed in the bead concave portion of the gasket and serves as a seal at the assembling time.

(4) In the metal base plate gasket, the effect of the present invention can be aimed by forming the concave portion housing the protruding portion by two rubber projections which are formed in the gasket surface, however, in order to strongly compress and seal the protruding portion, a bead constructed by a metal plate is preferable.

(5) A volumetric capacity (height and thickness) in the vicinity of the three-surface portion of the seal projection provided in the grommet is enlarged. As a result, a sealing performance can be secured even by arranging a chamfer in the casing.

(6) According to the present invention, since the seal projection is structured such as to protrude, a sealing performance between the casing and the grommet is excellent in the vicinity of the three-surface portion where a problem is generated in the prior art. Further, in the case that the protrusion is generated, a seal leakage due to the protrusion generates a problem in the prior example, however, since the protrusion is housed in the concave portion of the gasket bead so as to be compressed and form the sealing structure in the present invention, the problem of the seal leakage is done away.

Relevant to Third Aspect (7) The present invention provides a seal structure in which a cover member is attached to a casing to which a U-shaped grommet is installed from an opening surface side of the casing, via a metal base plate gasket having a bead, wherein a seal projection is provided at least in a grommet side surface which is bonded to the casing, a part of the seal projection is protruded to three surface portions where the casing, the grommet and the cover member are overlapped, the protruding portion is housed between bead concave portions which are bifurcated from a near side of the three-surface portion, and the protruding portion is compression sealed by the gasket at the assembling time.

(8) The bead concave portion can be formed as long as it is bifurcated at the three-surface portion and comes into contact with the bead, such as a shape that the bead portion of the gasket is bifurcated from the near side of the three-surface portion and the bead portions flow together at an end of the three-surface portion, and a shape that the beads flow together after passing the three-surface portion.

(9) In the metal base plate gasket, the effect of the present invention can be aimed by forming the concave portion housing the protruding portion by two rubber projections which are formed in the gasket surface, however, in order to strongly compress and seal the protruding portion, a bead constructed by a metal plate is preferable.

(10) A volumetric capacity (height and thickness) in the vicinity of the three-surface portion of the seal projection provided in the grommet is enlarged. As a result, a sealing performance can be secured even by arranging a chamfer in the casing.

(11) According to the present invention, the following operations and effects can be achieved.

(11-1) Since the seal projection is structured such as to protrude, a sealing performance between the casing and the grommet is excellent in the vicinity of the three-surface portion where a problem is generated in the prior art.

(11-2) A seal leakage due to the protrusion generates a problem in the prior documents, however, the protrusion can be compressed between the bifurcated bead convex portions of the gasket, and it is possible to seal without forming any gap.

(11-3) Further, the force generally escapes laterally only by applying the pressure from the above since the grommet is made of the rubber, however, the force can be applied from right and left sides of the grommet by providing two beads. Therefore, the force does not escape laterally, and the force can be efficiently applied vertically.

(11-4) Since the projection is structured such as to come into contact with the confluence portion of the beads in the gasket side, the pressing force can be applied to the projection toward the center of the grommet.

Relevant to Fifth Aspect

(12) The present invention provides a seal structure in which a cover member is attached to a casing to which a U-shaped grommet is installed from an opening surface side of the casing, via a rubber single body gasket, wherein a seal projection is provided at least in a grommet side surface which is bonded to the casing, a part of the seal projection is protruded to three surface portions where the casing, the grommet and the cover member are overlapped, the protruding portion is housed between seal lines which are bifurcated from a near side of the three-surface portion, and the protruding portion is compression sealed by the gasket at the assembling time.

(13) The seal line can be formed as long as it is bifurcated at the three-surface portion and comes into contact with the bead, such as a shape that the seal line of the gasket is bifurcated from the near side of the three-surface portion and the seal lines flow together at an end of the three-surface portion, and a shape that the seal lines flow together after passing the three-surface portion.

(14) According to the present invention, the following operations and effects can be achieved.

(14-1) Since the seal projection is structured such as to protrude, a sealing performance between the casing and the grommet is excellent in the vicinity of the three-surface portion where a problem is generated in the prior art.

(14-2) A seal leakage due to the protrusion generates a problem in the prior documents, however, the protrusion can be compressed between the bifurcated seal lines of the gasket, and it is possible to seal without forming any gap.

(14-3) Further, the force generally escapes laterally only by applying the pressure from the above since the grommet is made of the rubber, however, the force can be applied from right and left sides of the grommet by providing two seal lines. Therefore, the force does not escape laterally, and the force can be efficiently applied vertically.

(14-4) Since the projection is structured such as to come into contact with the confluence portion of the seal lines in the gasket side, the pressing force can be applied to the projection toward the center of the grommet.

EMBODIMENTS

Next, a description will be given of embodiments according to the present invention with reference to the accompanying drawings.

First Embodiment

Figure 2A:
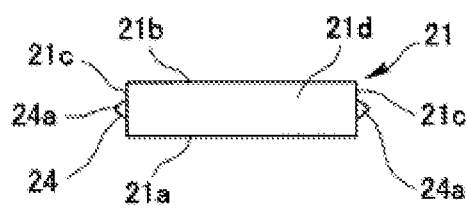
FIG. 2A is a plan view of a grommet which is provided in the seal structure.
Figure 2B:
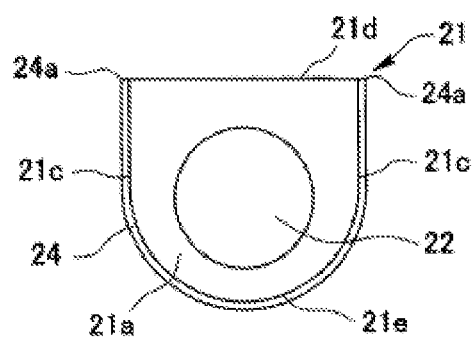
FIG. 2B is a front elevational view of the grommet.
Figure 2C:
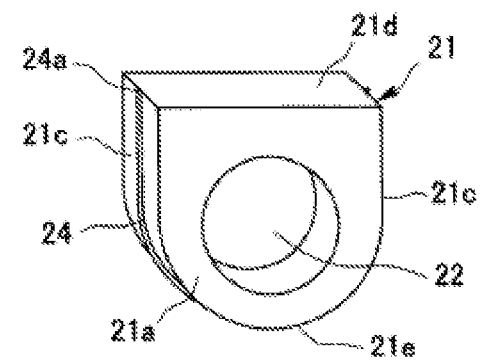
FIG. 2C is a perspective view of the grommet.
Figure 3A:
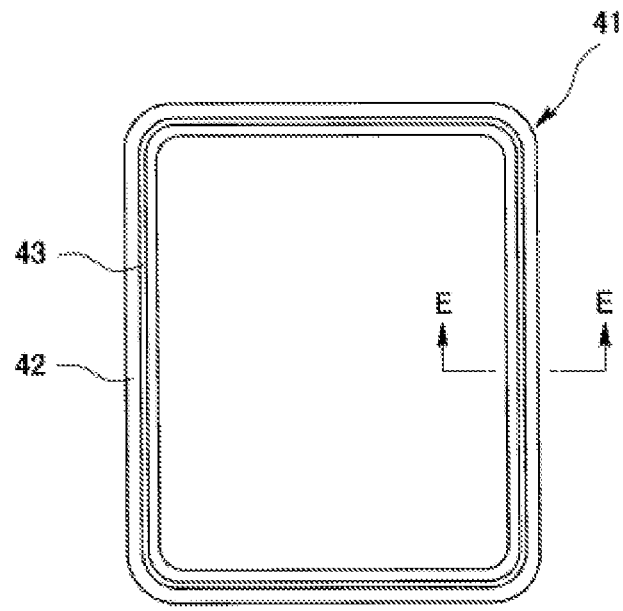
FIG. 3A is a plan view of a metal base plate gasket which is provided in the seal structure.
Figure 3B:
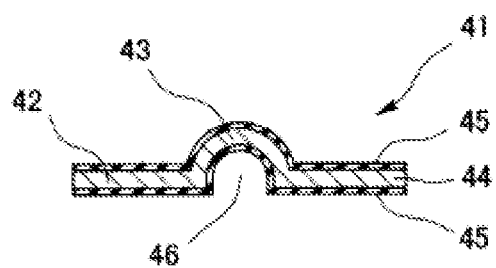
FIG. 3B is an enlarged cross sectional view of a substantial part of the metal base plate gasket and corresponds to an enlarged cross sectional view along a line E-E in FIG. 3A.
Figure 4A:
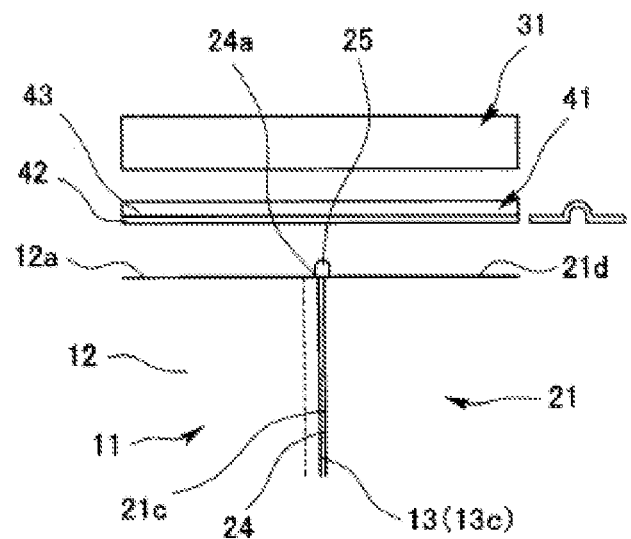
FIG. 4A is an explanatory view (a front elevational view) showing a state in which a predetermined crush is applied to the grommet in the seal structure.
Figure 4B:
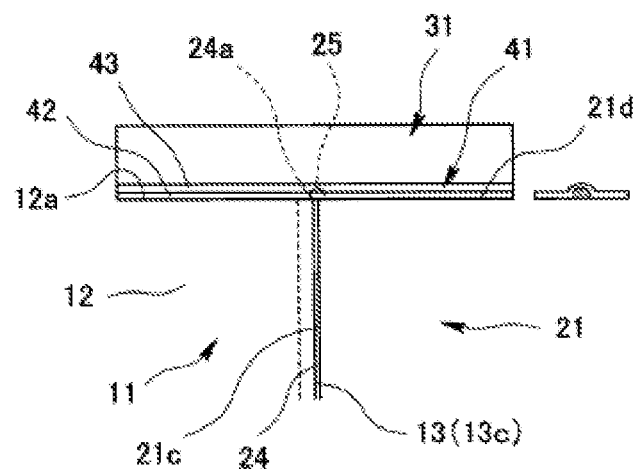
FIG. 4B is an explanatory view (a front elevational view) showing a state after being fastened in the seal structure.
Figure 5:
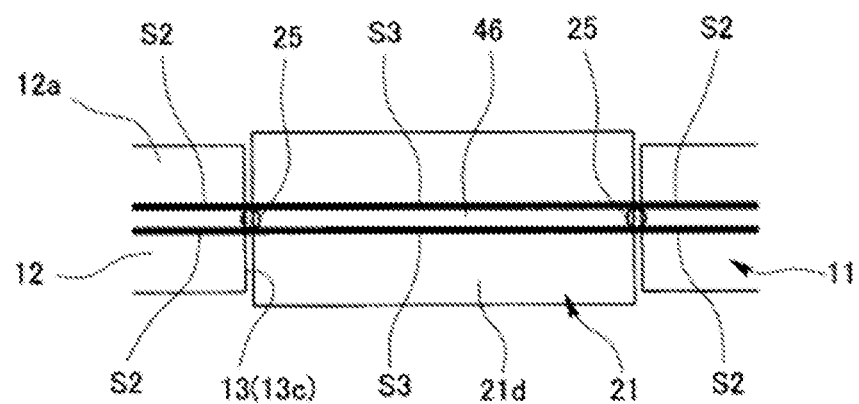
FIG. 5 is an explanatory view (a plan view) showing a layout of seal lines in the seal structure.

FIG. 1 shows a state before assembling a seal structure according to a first embodiment of the present invention, and a casing 11, a grommet 21, a cover 31 and a metal base plate gasket 41 are drawn. FIGS. 2A, 2B and 2C are views of a single part of the grommet 21, FIGS. 3A and 3B are views of a single part of the metal base plate gasket 41, FIGS. 4A and 4B and FIG. 5 are explanatory views of the seal structure. The seal structure according to the embodiment is structured such as to seal a section where three surfaces are joined together in an electric equipment device and an engine, and may be also called as a three-surface seal in the light of its function.

The casing 11 is formed by a rigid member such as a predetermined metal or a hard resin, and is provided with a vertically planate wall portion 12 as a rising portion in a side wall of the casing, and a notch-like grommet installation portion 13 is provided in the wall portion 12 so as to pass through in a wall portion thickness direction. The grommet installation portion 13 is open to an upper surface 12a of the wall portion 12. The grommet installation portion 13 is an insertion port of a harness or a piping in the electronic equipment device and the engine, and is sealed its opening by installing the grommet 21 thereto. Accordingly, in the present invention, the insertion port is called as a grommet installation portion. A front elevational shape of the grommet installation portion 13 is formed as a U-shaped form, that is, formed such a shape that is provided with a pair of right and left linear portions 13a which are parallel to each other and a curved portion 13b which is formed as a circular arc shape in a bottom portion, however, may be formed as the other shapes. For example, a pair of right and left linear portions 13a may be formed as an inverted trapezoidal shape that a width (a distance) is enlarged little by little toward the above. Further, it is possible to employ a shape which is provided only with the curved portion without any linear portion as shown in FIG. 20, as long as a protruding portion 25 by a seal projection 24 mentioned later can be formed.

The grommet 21 is formed by a predetermined rubber-like elastic body, and is formed as a block shape which approximately has the same shape and the same magnitude as a volumetric capacity shape of the grommet installation portion 13 for sealing the grommet installation portion 13 serving as the insertion port by being closely installed thereto. In the illustrated embodiment, since the grommet installation portion 13 is formed as a U-shaped form in its front surface as mentioned above, the grommet 21 is formed as a block shape which is provided with six surfaces constituted by a planate front surface 21a, a back surface 21b, a pair of right and left side surfaces 21c, an upper surface 21d and a curved bottom surface 21e in correspondence to the grommet installation portion 13. A through hole 22 for inserting the harness or the piping is provided in the center of a front surface of the grommet 21 so as to pass through in a grommet thickness direction. A sleeve 23 made of a rigid material for fitting the piping is installed to an inner peripheral surface of the through hole 22, however, the sleeve 23 may be omitted.

Further, one continuous seal projection 24 is provided in a surface facing to the inner surface 13c of the grommet installation portion 13 in the grommet 21, that is, a pair of right and left side surfaces and the curved bottom surface 21e so as to be positioned at the center in the grommet thickness direction, and the seal projection 24 is provided over a whole length in an arranging direction of three surfaces 21c and 21e. Therefore, one end portion 24a of the seal projection 24 is arranged in an upper side portion of one side surface 21c, and the other end portion 24a is arranged in an upper side portion of the other side surface 21c. As a result, the formation of the protruding portion 25 mentioned later is facilitated.

The seal projection 24 is compression deformed in the case that the seal projection is pressed to the inner surface 13c of the grommet installation portion 13, comes into close contact with the inner surface 13c of the grommet installation portion 13 on the basis of a reaction force generated at that time, and seals between the wall portion 12 and the grommet 21. Further, the seal projection 24 is compression deformed in the case that the seal projection is pressed to the inner surface 13c of the grommet installation portion 13, and the end portion 24a protrudes upward from the upper surfaces 12a and 21d of the wall portion 12 and the grommet 21 as shown in FIG. 4A at that time, thereby forming the protruding portion 25. In order to securely form the protruding portion 25, it is preferable to carry out an installing work from a direction which is opposite to a protruding direction of the protruding portion 25 in the case that the grommet 21 is installed to the grommet installation portion 13, and this direction is the same direction as a direction in which the cover 31 is put on the casing 11 (in other words, the grommet 21 is installed to the grommet installation portion 13 from the above in place of back and front sides in FIG. 1).

The metal base plate gasket 41 is structured such as to be interposed between the wall portion 12 of the casing 11 and the grommet 21, and the cover 31, and is provided with a planate base plate portion 42, a width of the base plate portion 42 is made approximately equal to a width of the upper surface 12a of the wall portion 12, and one full bead 43 having a circular arc cross sectional shape is integrally provided so as to be positioned at the center in a width direction of the base plate portion 42. Since the metal base plate gasket 41 is structured such as to seal between the wall portion 12 of the casing 11 and the cover 31 over a whole periphery, the metal base plate gasket is formed as an endless shape while being provided with the same plane shape as a plane shape of the wall portion 12 as shown in FIG. 3A, and the full bead 43 is also formed as an endless shape in the same manner. Further, the metal base plate gasket 41 is formed as a laminated type gasket in which a rubber layer 45 is attached to both surfaces in the thickness direction of the metal plate 44 as shown in FIG. 3B so as to enhance a sealing performance between the wall portion 12 and the cover 31, however, may be formed as a single layer type gasket which is constructed only by the metal plate 44 by omitting the rubber layer 45.

The metal base plate gasket 41 is installed so as to direct a bulge (a circular arc bulge) constructed by the full bead 43 to the cover 31 (upward in FIG. 1), and is pinched in this state. Therefore, one seal line 51 (not shown) constructed by a top portion of the bead circular arc is formed in an upper surface of the metal base plate gasket 41 in relation to the cover 31 above the gasket, at the pinching time. Further, two seal lines S2 which are parallel to each other and are constructed by both ends of the bead circular arc are formed in a lower surface of the metal base plate gasket 41 in relation to the wall portion 12 below the gasket, and two seal lines S3 which are parallel to each other and are constructed by both ends of the bead circular arc are formed in relation to the grommet 21 below the gasket in the same manner, as shown in FIG. 5. The seal lines S2 and the seal lines S3 are continuously provided with each other. Further, a series of groove-like concave portion 46 is formed by a depression in the inner side of the bead circular arc, on the lower surface of the gasket 41, and the groove-like concave portion 46 is sandwiched in its both sides in a width direction by two seal lines S2 and S3.

In the case that the seal structure having the constructing elements is assembled, and the grommet 21 and the metal base plate gasket 41 are pinched in a vertical direction between the casing 11 and the cover 31, the seal projection 24 provided in a thickness surface of the grommet 21 (a pair of right and left side surfaces 21c and the bottom surface 21e) comes into close contact with the inner surface 13c of the grommet installation portion 13. As a result, the wall portion 12 of the casing 11 and the grommet 21 are sealed therebetween. The grommet 21 and the metal base plate gasket 41, the wall portion 12 of the casing 11 and the metal base plate gasket 41, and the metal base plate gasket 41 and the cover 31 are respectively sealed therebetween on the basis of the close contact by the pinching.

Further, since a position where respective surfaces of the wall portion 12 of the casing 11, the grommet 21 and the metal base plate gasket 41 intersect is formed as a section where three surfaces are joined together, there is fear that a gap is generated in the corner portion, however, in the seal structure having the structure mentioned above, the protruding portion 25 is formed in the end portion of the seal projection 24, and the protruding portion 25 is closely compressed within the groove-like concave portion 46 in the metal base plate gasket 41 at the pinching time, as shown in FIGS. 4A and 4B. As a result, since the protruding portion 25 securely comes into contact with the metal base plate gasket 41, a gap is not generated.

Accordingly, since the gap is not generated in the corner portion of the section where three surfaces are joined together, and a sealing performance can be secured over a whole periphery of the thickness surface of the grommet 21, it is possible to provide the three-surface seal structure which can achieve an excellent sealing performance.

With regard to the seal projection 24, the seal projection 24 is continuously provided in a pair of right and left side surfaces 21c and the bottom surface 21e in the thickness surface of the grommet 21 in the embodiment mentioned above, however, the seal projection 24 may be continuously provided in the upper surface 21d in addition to a pair of right and left side surfaces 21c and the bottom surface 21e. In this case, since a position where the seal projection provided in the side surfaces 21c and the seal projection provided in the upper surface 21d intersect protrudes further upward from the seal projection provided in the upper surface 21d at the pinching time, this position is utilized as the protruding portion 25.

Figure 2D:
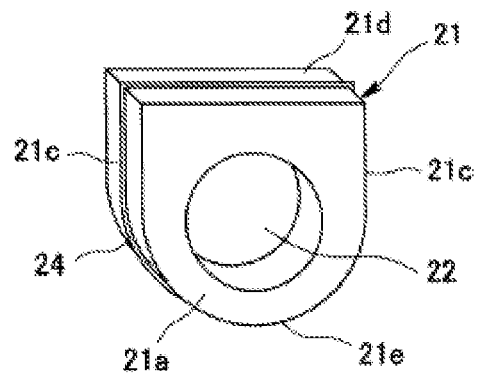
FIG. 2D is a perspective view showing the other example of the grommet.

As an example of this, in FIG. 2D, the seal projection 24 is continuously provided in the upper surface 21d in addition to a pair of right and left side surfaces 21c and the bottom surface 21e, and the seal projection 24 is provided as an endless shaped structure over a whole periphery of the thickness surface of the grommet 21 (a pair of right and left side surfaces 21c, the bottom surface 21e and the upper surface 21d).

Figure 3C:
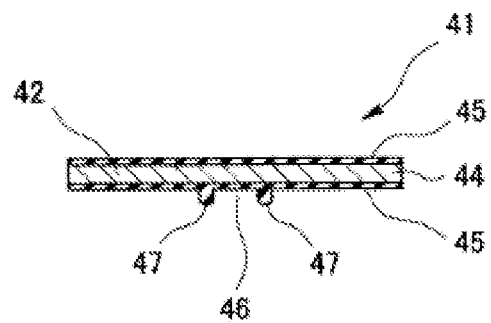
FIG. 3C is a cross sectional view of a substantial part and shows the other example of the metal base plate gasket.

Further, in the embodiment mentioned above, with regard to the metal base plate gasket 41, the full bead 43 having the circular arc shaped cross section is provided by applying a press molding to the planate base plate portion 42, however, two seal beads 47 made of a rubber-like elastic material may be alternatively adhered in parallel to one surface in a thickness direction of the planate base plate portion 42 as shown in FIG. 3C. In this case, since two seal lines are formed by two seal beads 47 and the groove-like concave portion 46 is formed by a depression between two seal beads 47, the metal base plate gasket 41 is installed so that two seal beads 47 are directed to the wall portion 12 of the casing 11 and the grommet 21. In the example in FIG. 3C, since the metal base plate gasket 41 is formed as the laminated type gasket in which the rubber layer 45 is attached to both surfaces in the thickness direction of the metal plate 44, two seal beads 47 are integrally provided in one rubber layer 45, however, in the case that the rubber layer 45 is omitted, the seal beads 47 are directly adhered to the metal plate 44.

Further, although an illustration will be omitted, the metal base plate gasket may be structured such that two full beads each having a circular arc shaped cross section are provided in a planate base plate portion. In this case, since two seal lines are formed by top portions of the bead circular arcs and the groove-like concave portion is formed by the depression between two full beads, the metal base plate gasket is installed so that a bulge formed by the full beads is directed to the wall portion 12 of the casing 11 and the grommet 21.

Figure 6A:
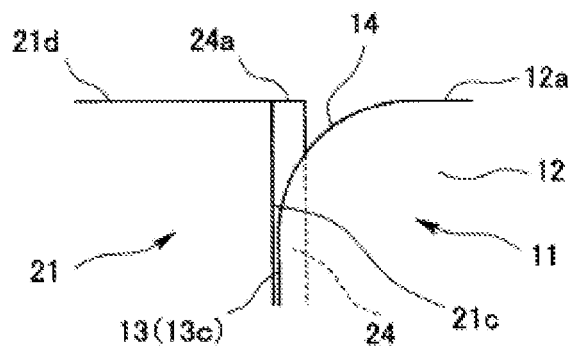
FIG. 6A is an explanatory view in the case that a chamfer portion is provided in a grommet installation portion.

Further, with regard to the notch-like grommet installation portion 13 provided in the casing 11, there can be thought that a chamfer portion 14 is provided in an edge portion of the inner surface 13c in the grommet installation portion 13 (a portion where the upper surface 12a of the wall portion 12 intersects the inner surface 13c of the grommet installation portion 13) as shown in FIG. 6A so as to facilitate a grommet installing work. In this case, the seal projection 24 is not sufficiently compressed in the position at which the seal projection 24 faces to the chamfer portion 14, in the case that a cross sectional shape of the seal projection 24 is uniform over a whole length of the seal projection 24. As a result, there is fear that a sealing performance of the portion is hard to be secured, and the protruding portion 25 is hard to be formed. Therefore, in order to devise a countermeasure thereof, it is preferable to set a cross sectional shape (a cross sectional area) of the position facing to the chamfer portion 14 in the seal projection 24 to a shape which is enlarged little by little in correspondence to the shape of the chamfer portion 14, and make this position be sufficiently compressed by the chamfer portion 14. The position facing to the chamfer portion 14 in the seal projection 24 is formed so that its cross sectional shape becomes larger in correspondence to an enlargement of the distance between the grommet 21 and the casing 11.

Figure 6B:
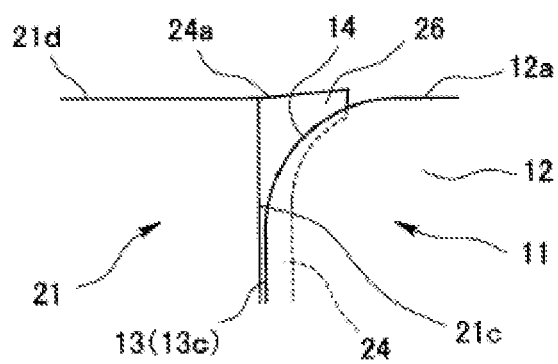
FIGS. 6B and 6C are explanatory views of seal structures according to the other embodiments of the present invention.

As an example thereof, in FIG. 6B, the seal projection 24 is provided in the side surface 21c of the grommet 21, and an overhanging portion 26 overhanging toward the chamfer portion 14 (toward a lateral direction) is provided at a position facing to the chamfer portion 14 in the seal projection 24. As a result, the cross sectional shape of this position is formed as a shape which is enlarged little by little in correspondence to the shape of the chamfer portion 14.

Figure 6C:
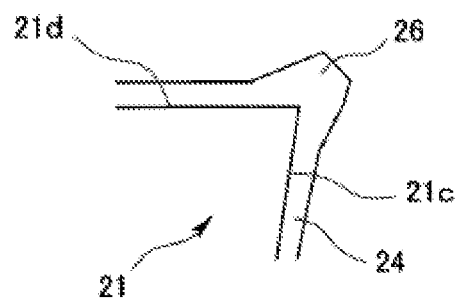

Further, in an example in FIG. 6C, the seal projection 24 is provided in the side surfaces 21c and the upper surface 21d of the grommet 21, and an overhanging portion 26 overhanging toward the chamfer portion 14 (toward a diagonally upward side) is provided at a position facing to the chamfer portion 14 in the seal projection 24. As a result, the cross sectional shape of this position is formed as a shape which is enlarged little by little in correspondence to the shape of the chamfer portion 14.

Therefore, according to these structures, even in the case that the chamfer portion 14 is provided in the edge portion of the inner surface 13c in the grommet installation portion 13, it is possible to securely seal between the wall portion 12 of the casing 11 and the grommet 21, and it is possible to securely form the protruding portion 25 by the seal projection 24.

Second Embodiment

Figure 7:
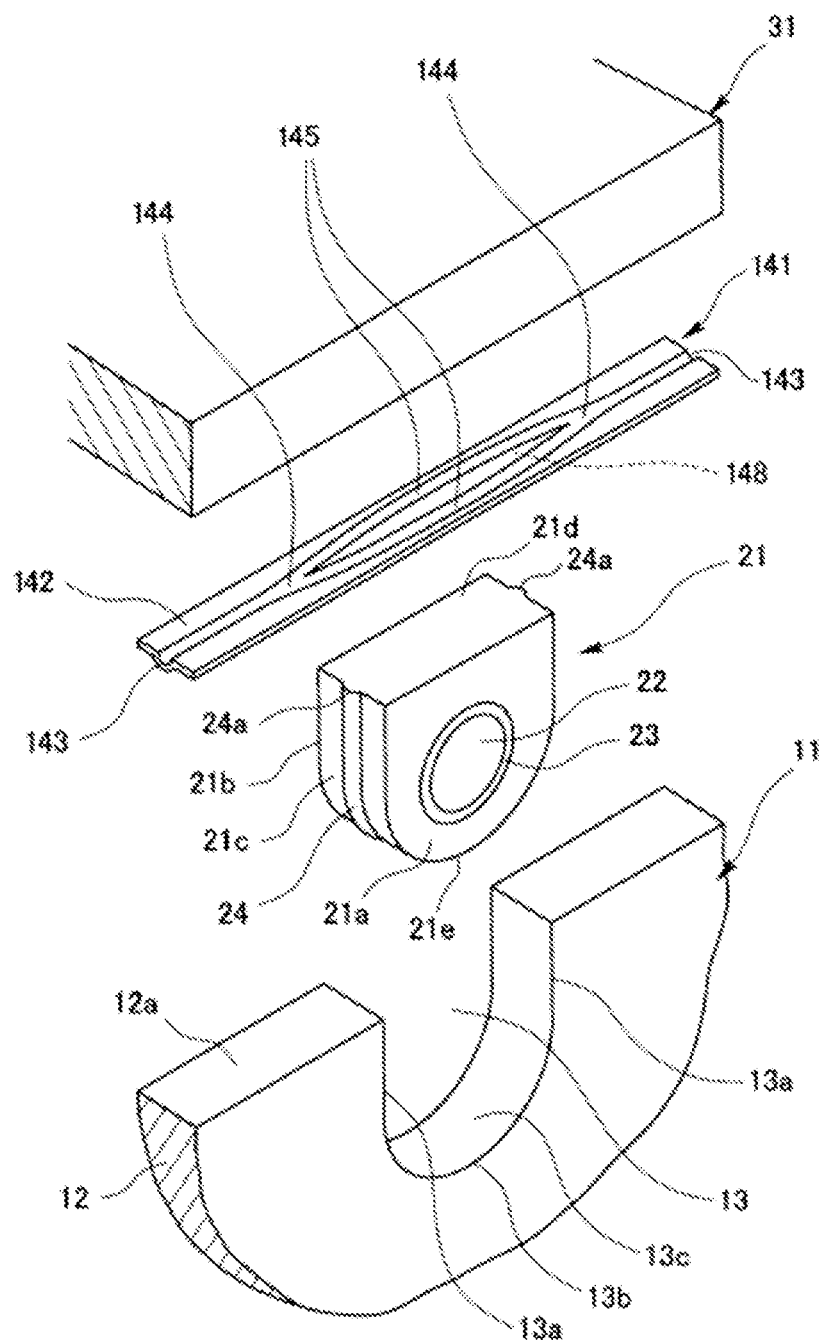
FIG. 7 is a perspective view showing a state before assembling a seal structure according to a second embodiment of the present invention.
Figure 8A:
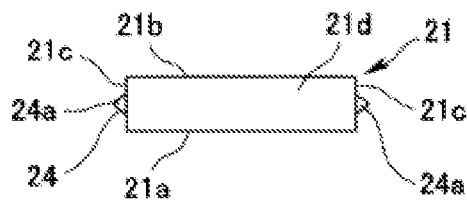
FIG. 8A is a plan view of a grommet which is provided in the seal structure.
Figure 8B:
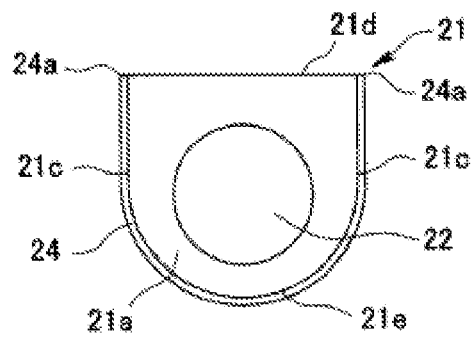
FIG. 8B is a front elevational view of the grommet.
Figure 8C:
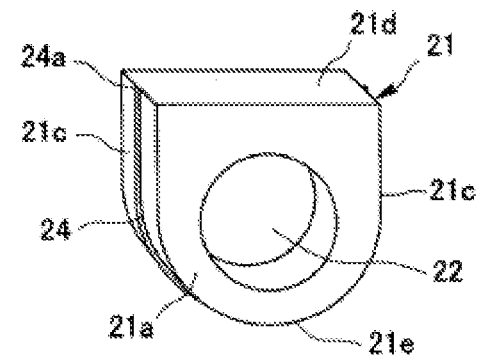
FIG. 8C is a perspective view of the grommet.
Figure 10A:
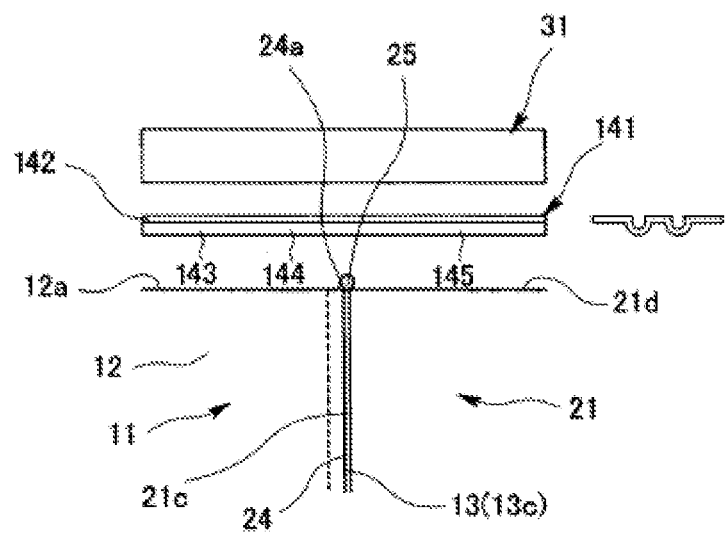
FIG. 10A is an explanatory view (a front elevational view) showing a state in which a predetermined crush is applied to the grommet in the seal structure.
Figure 10B:
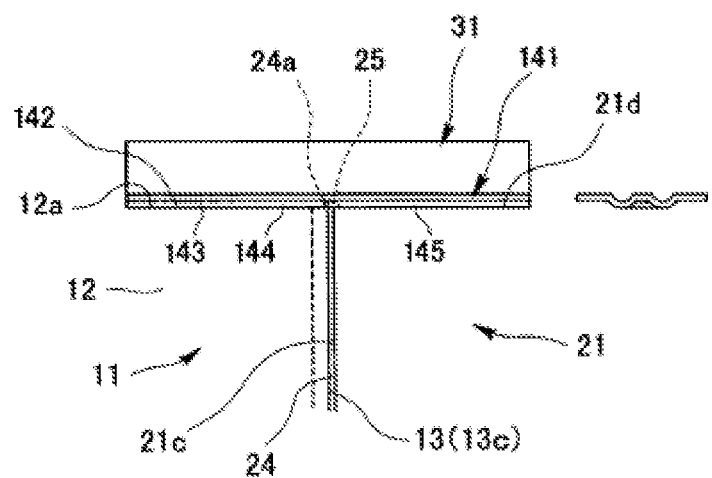
FIG. 10B is an explanatory view (a front elevational view) showing a state after being fastened in the seal structure.
Figure 11A:
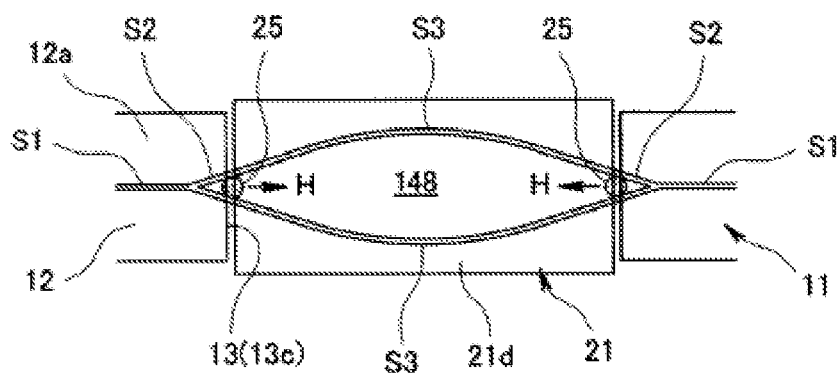
FIG. 11A is an explanatory view (a plan view) showing a layout of seal lines in the seal structure.

FIG. 7 shows a state before assembling a seal structure according to a second embodiment of the present invention, and a casing 11, a grommet 21, a cover 31 and a metal base plate gasket 141 are drawn. FIGS. 8A, 8B and 8C are views of a single part of the grommet 21, FIGS. 9A, 9B and 9C are views of a single part of the metal base plate gasket 141, FIGS. 10A and 10B and FIG. 11A are explanatory views of the seal structure. The seal structure according to the embodiment is structured such as to seal a section where three surfaces are joined together in an electric equipment device and an engine, and may be also called as a three-surface seal in the light of its function.

The casing 11 is formed by a rigid member such as a predetermined metal or a hard resin, and is provided with a vertically planate wall portion 12 as a rising portion in a side wall of the casing, and a notch-like grommet installation portion 13 is provided in the wall portion 12 so as to pass through in a wall portion thickness direction. The grommet installation portion 13 is open to an upper surface 12a of the wall portion 12. The grommet installation portion 13 is an insertion port of a harness or a piping in the electronic equipment device and the engine, and is sealed its opening by installing the grommet 21 thereto. Accordingly, in the present invention, the insertion port is called as a grommet installation portion. A front elevational shape of the grommet installation portion 13 is formed as a U-shaped form, that is, formed such a shape that is provided with a pair of right and left linear portions 13a which are parallel to each other and a curved portion 13b which is formed as a circular arc shape in a bottom portion, however, may be formed as the other shapes. For example, a pair of right and left linear portions 13a may be formed as an inverted trapezoidal shape that a width (a distance) is enlarged little by little toward the above. Further, it is possible to employ a shape which is provided only with the curved portion without any linear portion as shown in FIG. 20, as long as a protruding portion 25 by a seal projection 24 mentioned later can be formed.

The grommet 21 is formed by a predetermined rubber-like elastic body, and is formed as a block shape which approximately has the same shape and the same magnitude as a volumetric capacity shape of the grommet installation portion 13 for sealing the grommet installation portion 13 serving as the insertion port by being closely installed thereto. In the illustrated embodiment, since the grommet installation portion 13 is formed as a U-shaped form in its front surface as mentioned above, the grommet 21 is formed as a block shape which is provided with six surfaces constituted by a planate front surface 21a, a back surface 21b, a pair of right and left side surfaces 21c, an upper surface 21d and a curved bottom surface 21e in correspondence to the grommet installation portion 13. A through hole 22 for inserting the harness or the piping is provided in the center of a front surface of the grommet 21 so as to pass through in a grommet thickness direction. A sleeve 23 made of a rigid material for fitting the piping is installed to an inner peripheral surface of the through hole 22, however, the sleeve 23 may be omitted.

Further, one continuous seal projection 24 is provided in a surface facing to the inner surface 13c of the grommet installation portion 13 in the grommet 21, that is, a pair of right and left side surfaces and the curved bottom surface 21e so as to be positioned at the center in the grommet thickness direction, and the seal projection 24 is provided over a whole length in an arranging direction of three surfaces 21c and 21e. Therefore, one end portion 24a of the seal projection 24 is arranged in an upper side portion of one side surface 21c, and the other end portion 24a is arranged in an upper side portion of the other side surface 21c. As a result, the formation of the protruding portion 25 mentioned later is facilitated.

The seal projection 24 is compression deformed in the case that the seal projection is pressed to the inner surface 13c of the grommet installation portion 13, comes into close contact with the inner surface 13c of the grommet installation portion 13 on the basis of a reaction force generated at that time, and seals between the wall portion 12 and the grommet 21. Further, the seal projection 24 is compression deformed in the case that the seal projection is pressed to the inner surface 13c of the grommet installation portion 13, and the end portion 24a protrudes upward from the upper surfaces 12a and 21d of the wall portion 12 and the grommet 21 as shown in FIG. 10A at that time, thereby forming the protruding portion 25. In order to securely form the protruding portion 25, it is preferable to carry out an installing work from a direction which is opposite to a protruding direction of the protruding portion 25 in the case that the grommet 21 is installed to the grommet installation portion 13, and this direction is the same direction as a direction in which the cover 31 is put on the casing 11 (in other words, the grommet 21 is installed to the grommet installation portion 13 from the above in place of back and front sides in FIG. 7).

The metal base plate gasket 141 is structured such as to be interposed between the wall portion 12 of the casing 11 and the grommet 21, and the cover 31, and is provided with a planate base plate portion 142, a width of the base plate portion 142 is made approximately equal to a width of the upper surface 12a of the wall portion 12, one full bead 143 having a circular arc shaped cross section and branch portions 144 obtained by branching one full bead 143 into two sections and having a Y-shaped plane are integrally provided in a surface facing to the wall portion 12 at the installing time in a gasket longitudinal direction in the base plate portion 142, and two full beads 145 continuously arranged from the branch portions 144 are integrally provided in a surface facing to the grommet 21. Further, since the branch portions 144 provided in the surface facing to the wall portion 12 are respectively provided in both sides while sandwiching the surface facing to the grommet 21 therebetween, and are provided so as to be opposed to each other, two full beads 145 are provided so as to connect a pair of branch portions 144. Since the metal base plate gasket 141 is structured such as to seal between the wall portion 12 of the casing 11 and the cover 31 over a whole periphery, the metal base plate gasket is formed as an endless shape while being provided with the same plane shape as a plane shape of the wall portion 12 as shown in FIG. 9A, and the bead portion constructed by one full bead 143, the branch portions 144 and two full beads 145 is also formed as an endless shape in the same manner. Further, the metal base plate gasket 141 is formed as a laminated type gasket in which a rubber layer 147 is attached to both surfaces in the thickness direction of a metal plate 146 as shown in FIGS. 9B and 9C so as to enhance a sealing performance between the wall portion 12 and the cover 31, however, may be formed as a single layer type gasket which is constructed only by the metal plate 146 by omitting the rubber layer 147.

The metal base plate gasket 141 is installed in a state in which the bulge (the circular arc shaped bulge) constructed by the full beads 143 and 145 and the branch portion 144 is directed to the wall portion 12 of the casing 11 and the grommet 21 (a downward direction in FIG. 7), and is pinched in the state. Accordingly, as shown in FIG. 11A, one seal line 51 constructed by a top portion of one full bead 143 and a branch portion line S2 constructed by a top portion of the branch portion 144 and having a Y-shaped plane are formed in a surface facing to the wall portion 12 in a lower surface of the metal base plate gasket 141, and two seal lines S3 constructed by respective top portions of two full beads 145 are formed in a surface facing to the grommet 21, at the pinching time. Further, they are continuously provided as illustrated. Further, a concave portion 148 is formed in a lower surface of the gasket 141 so as to be surrounded by the branch portion 144 and two full beads 145, and the concave portion 148 is structured such that its periphery is surrounded by the branch portion line S2 and two seal lines S3, as shown in FIG. 11A. Therefore, the concave portion 148 is finite in a gasket longitudinal direction, its end portion in the longitudinal direction is arranged so as to face to the wall portion 12 in place of the grommet 21, and the protruding portion 25 constructed by the seal projection 24 is accordingly arranged just inside the branch portion 144 within the concave portion 148. Further, a plane shape of the end portion in the longitudinal direction of the concave portion 148 is formed as a V-shaped plane narrowing forward in connection with the Y-shaped plane of the plane shape in the branch portion 144.

In the case that the seal structure having the constructing elements is assembled, and the grommet 21 and the metal base plate gasket 141 are pinched in a vertical direction between the casing 11 and the cover 31, the seal projection 24 provided in a thickness surface of the grommet 21 (a pair of right and left side surfaces 21c and the bottom surface 21e) comes into close contact with the inner surface 13c of the grommet installation portion 13. As a result, the wall portion 12 of the casing 11 and the grommet 21 are sealed therebetween. The grommet 21 and the metal base plate gasket 141, the wall portion 12 of the casing 11 and the metal base plate gasket 141, and the metal base plate gasket 141 and the cover 31 are respectively sealed therebetween on the basis of the close contact by the pinching.

Further, since a position where respective surfaces of the wall portion 12 of the casing 11, the grommet 21 and the metal base plate gasket 141 intersect is formed as a section where three surfaces are joined together, there is fear that a gap is generated in the corner portion, however, in the seal structure having the structure mentioned above, the protruding portion 25 is formed in the end portion of the seal projection 24, and the protruding portion 25 is closely compressed within the concave portion 148 in the metal base plate gasket 141 at the pinching time, as shown in FIGS.

10A and 10B. As a result, since the protruding portion 25 securely comes into contact with the metal base plate gasket 141, a gap is not generated.

Further, in the embodiment according to the present invention, since the branch portion 144 having the Y-shaped plane is provided in the metal base plate gasket 141, and the branch portion 144 is structured such as to compress the protruding portion 25 of the seal projection 24 in its inner side, the bifurcated branch portion 144 presses the protruding portion 25 toward the center in a grommet width direction on the basis of the application of the pinching force (since the protruding portion 25 is pressed to the end portion in the longitudinal direction of the concave portion 148 having the V-shaped plane, the protruding portion 25 is pressed toward the center in the grommet width direction (a lateral direction in FIG. 11A) by the branch portion 144 as shown by an arrow H in FIG. 11A). Therefore, since a reaction force to the pressing force (a reaction force toward the end portion in the grommet width direction) is generated in the protruding portion 25, it is possible to further effectively inhibit the gap from being formed.

Accordingly, since the gap is not generated in the corner portion of the section where three surfaces are joined together, and a sealing performance can be secured over a whole periphery of the thickness surface of the grommet 21, it is possible to provide the three-surface seal structure which can achieve an excellent sealing performance.

With regard to the seal projection 24, the seal projection 24 is continuously provided in a pair of right and left side surfaces 21c and the bottom surface 21e in the thickness surface of the grommet 21 in the embodiment mentioned above, however, the seal projection 24 may be continuously provided in the upper surface 21d in addition to a pair of right and left side surfaces 21c and the bottom surface 21e. In this case, since a position where the seal projection provided in the side surfaces 21c and the seal projection provided in the upper surface 21d intersect protrudes further upward from the seal projection provided in the upper surface 21d at the pinching time, this position is utilized as the protruding portion 25.

Figure 8D:
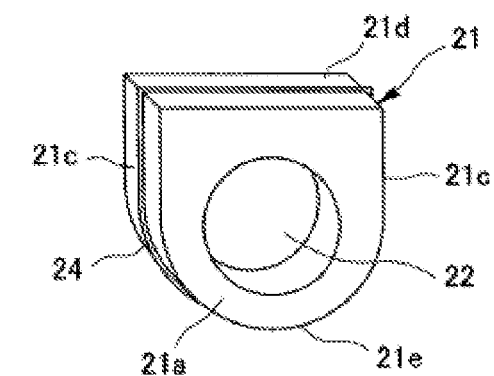
FIG. 8D is a perspective view showing the other example of the grommet.

As an example of this, in FIG. 8D, the seal projection 24 is continuously provided in the upper surface 21d in addition to a pair of right and left side surfaces 21c and the bottom surface 21e, and the seal projection 24 is provided as an endless shaped structure over a whole periphery of the thickness surface of the grommet 21 (a pair of right and left side surfaces 21c, the bottom surface 21e and the upper surface 21d).

Further, in the embodiment mentioned above, with regard to the metal base plate gasket 141, the bead portion constructed by one full bead 143, the branch portion 144 and two full beads 145 is provided by applying a press molding to the planate base plate portion 142, however, seal beads 149 made of a rubber-like elastic material may be alternatively provided on one surface in a thickness direction of the planate base plate portion 142 according to the same plane layout, as shown in FIG. 9D. In the example in FIG. 9D, since the metal base plate gasket 141 is formed as the laminated type gasket in which the rubber layer 147 is attached to both surfaces in the thickness direction of the metal plate 146, the seal beads 149 are integrally provided in one rubber layer 147, however, in the case that the rubber layer 147 is omitted, the seal beads 149 are directly adhered to the metal plate 146.

Figure 11B:
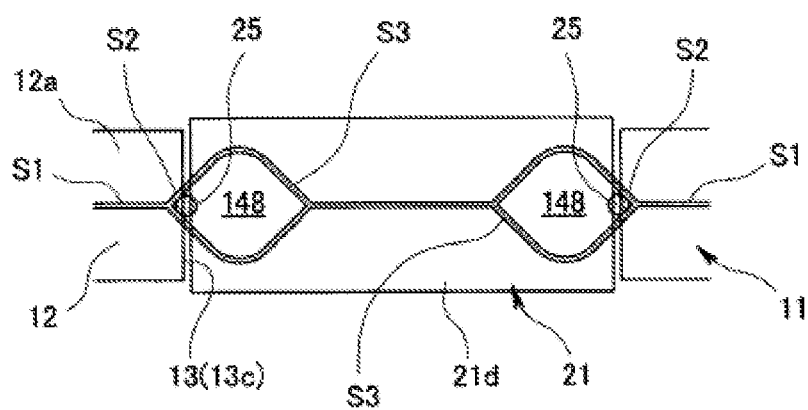
FIG. 11B is an explanatory view (a plan view) showing the other example of the layout of the seal lines.

Further, in the embodiment mentioned above, with regard to the metal base plate gasket 141, two full beads 145 which are continuously provided from the branch portion 144 are arranged in the surface facing to the grommet 21, and two seal lines S3 are formed by these two full beads 145, however, these two full beads 145 and two seal lines S3 may be converted into one within the surface facing to the grommet 21 as shown in FIG. 11B. In this case, the concave portion 148 housing the protruding portion 25 is set at two positions in the gasket longitudinal direction.

Figure 12A:
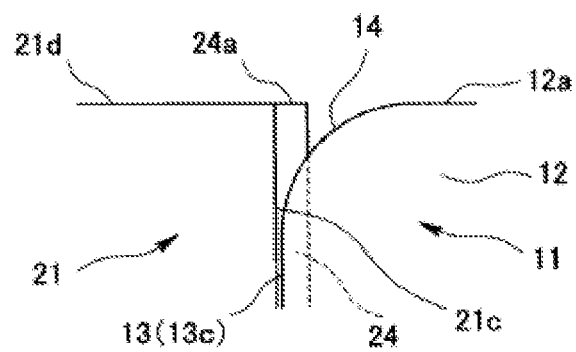
FIG. 12A is an explanatory view in the case that a chamfer portion is provided in a grommet installation portion.

Further, with regard to the notch-like grommet installation portion 13 provided in the casing 11, there can be thought that a chamfer portion 14 is provided in an edge portion of the inner surface 13c in the grommet installation portion 13 (a portion where the upper surface 12a of the wall portion 12 intersects the inner surface 13c of the grommet installation portion 13) as shown in FIG. 12A so as to facilitate a grommet installing work. In this case, the seal projection 24 is not sufficiently compressed in the position at which the seal projection 24 faces to the chamfer portion 14, in the case that a cross sectional shape of the seal projection 24 is uniform over a whole length of the seal projection 24. As a result, there is fear that a sealing performance of the portion is hard to be secured, and the protruding portion 25 is hard to be formed. Therefore, in order to devise a countermeasure thereof, it is preferable to set a cross sectional shape (a cross sectional area) of the position facing to the chamfer portion 14 in the seal projection 24 to a shape which is enlarged little by little in correspondence to the shape of the chamfer portion 14, and make this position be sufficiently compressed by the chamfer portion 14. The position facing to the chamfer portion 14 in the seal projection 24 is formed so that its cross sectional shape becomes larger in correspondence to an enlargement of the distance between the grommet 21 and the casing 11.

Figure 12B:
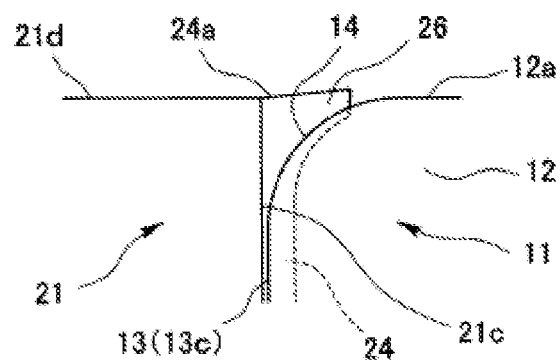
FIGS. 12B and 12C are explanatory views of seal structures according to the other embodiments of the present invention.

As an example thereof, in FIG. 12B, the seal projection 24 is provided in the side surface 21c of the grommet 21, and an overhanging portion 26 overhanging toward the chamfer portion 14 (toward a lateral direction) is provided at a position facing to the chamfer portion 14 in the seal projection 24. As a result, the cross sectional shape of this position is formed as a shape which is enlarged little by little in correspondence to the shape of the chamfer portion 14.

Figure 12C:
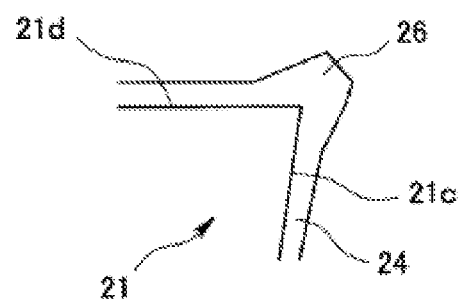

Further, in an example in FIG. 12C, the seal projection 24 is provided in the side surfaces 21c and the upper surface 21d of the grommet 21, and an overhanging portion 26 overhanging toward the chamfer portion 14 (toward a diagonally upward side) is provided at a position facing to the chamfer portion 14 in the seal projection 24. As a result, the cross sectional shape of this position is formed as a shape which is enlarged little by little in correspondence to the shape of the chamfer portion 14.

Therefore, according to these structures, even in the case that the chamfer portion 14 is provided in the edge portion of the inner surface 13c in the grommet installation portion 13, it is possible to securely seal between the wall portion 12 of the casing 11 and the grommet 21, and it is possible to securely form the protruding portion 25 by the seal projection 24.

Third Embodiment

Figure 13:
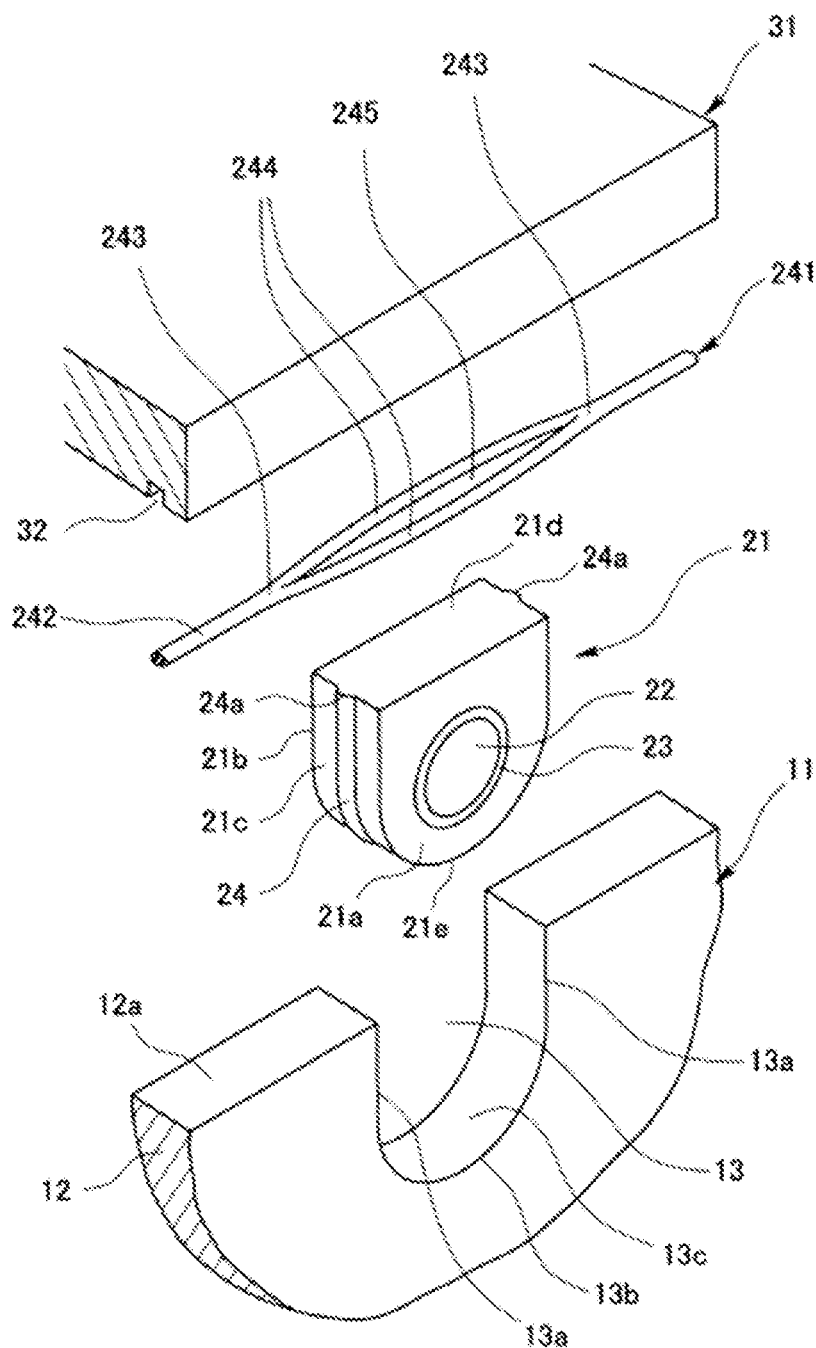
FIG. 13 is a perspective view showing a state before assembling a seal structure according to a third embodiment of the present invention.
Figure 14A:
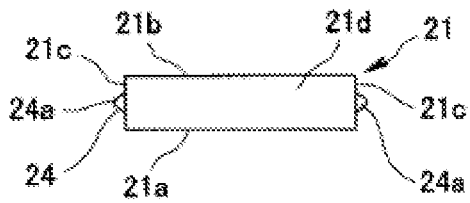
FIG. 14A is a plan view of a grommet which is provided in the seal structure.
Figure 14B:
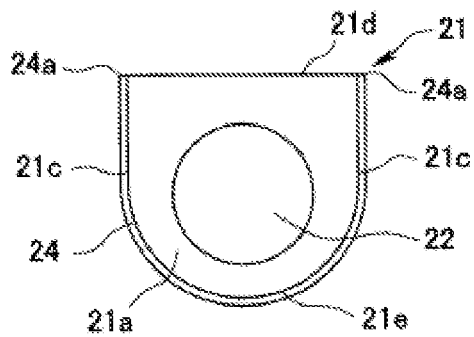
FIG. 14B is a front elevational view of the grommet.
Figure 14C:
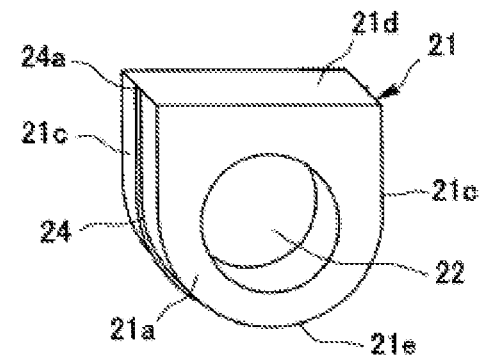
FIG. 14C is a perspective view of the grommet.
Figure 15A:
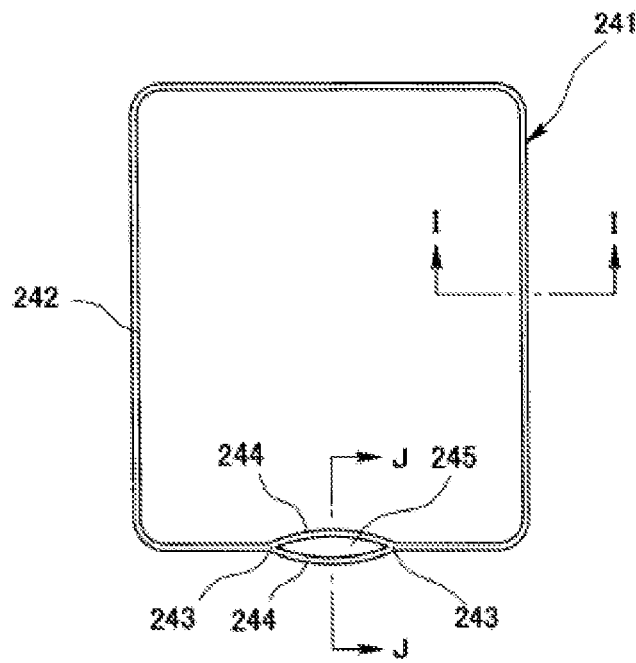
FIG. 15A is a plan view of a rubber single body gasket which is provided in the seal structure.
Figure 15B:
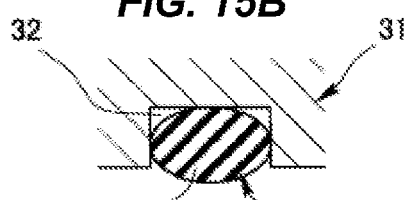
FIG. 15B is an enlarged cross sectional view of a substantial part of the rubber single body gasket in an installed state and corresponds to an enlarged cross sectional view along a line I-I in FIG. 15A.
Figure 15C:
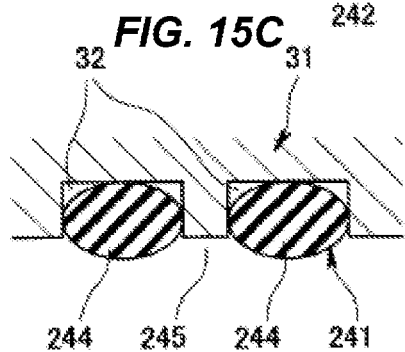
FIG. 15C is an enlarged cross sectional view of the substantial part of the rubber single body gasket in the installed state and corresponds to an enlarged cross sectional view along a line J-J in FIG. 15A.
Figure 18A:
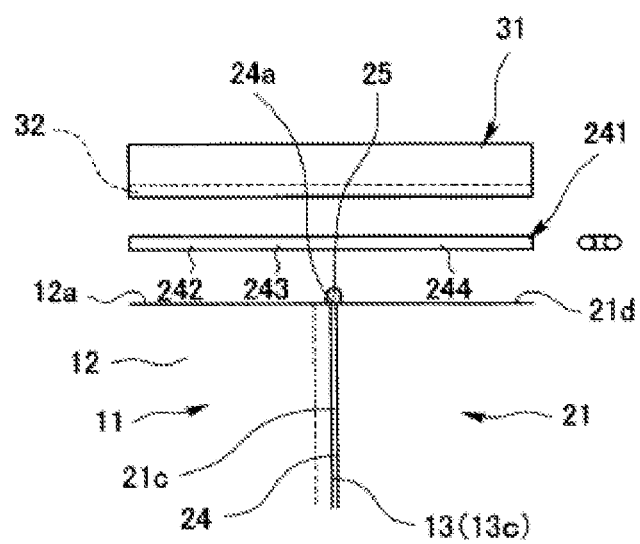
FIG. 18A is an explanatory view (a front elevational view) showing a state in which a predetermined crush is applied to the grommet in the seal structure.
Figure 18B:
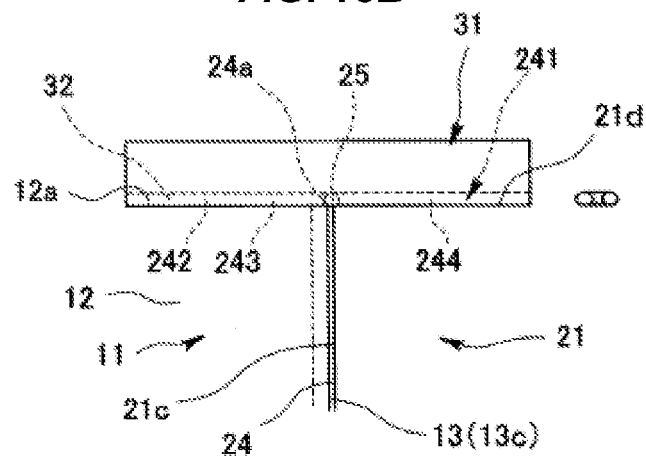
FIG. 18B is an explanatory view (a front elevational view) showing a state after being fastened in the seal structure.
Figure 19A:
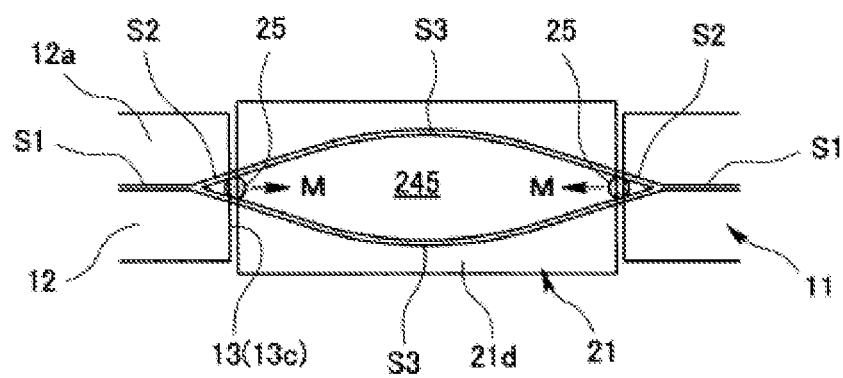
FIG. 19A is an explanatory view (a plan view) showing a layout of seal lines in the seal structure.

FIG. 13 shows a state before assembling a seal structure according to a third embodiment of the present invention, and a casing 11, a grommet 21, a cover 31 and a rubber single body gasket 241 are drawn. FIGS. 14A, 14B and 14C are views of a single part of the grommet 21, FIGS. 15A, 15B and 15C are view of a single part of the rubber single body gasket 241, FIGS. 18A and 18B and FIG. 19A are explanatory views of the seal structure. The seal structure according to the embodiment is structured such as to seal a section where three surfaces are joined together in an electric equipment device and an engine, and may be also called as a three-surface seal in the light of its function.

The casing 11 is formed by a rigid member such as a predetermined metal or a hard resin, and is provided with a vertically planate wall portion 12 as a rising portion in a side wall of the casing, and a notch-like grommet installation portion 13 is provided in the wall portion 12 so as to pass through in a wall portion thickness direction. The grommet installation portion 13 is open to an upper surface 12a of the wall portion 12. The grommet installation portion 13 is an insertion port of a harness or a piping in the electronic equipment device and the engine, and is sealed its opening by installing the grommet 21 thereto. Accordingly, in the present invention, the insertion port is called as a grommet installation portion. A front elevational shape of the grommet installation portion 13 is formed as a U-shaped form, that is, formed such a shape that is provided with a pair of right and left linear portions 13a which are parallel to each other and a curved portion 13b which is formed as a circular arc shape in a bottom portion, however, may be formed as the other shapes. For example, a pair of right and left linear portions 13a may be formed as an inverted trapezoidal shape that a width (a distance) is enlarged little by little toward the above. Further, it is possible to employ a shape which is provided only with the curved portion without any linear portion as shown in FIG. 20, as long as a protruding portion 25 by a seal projection 24 mentioned later can be formed.

The grommet 21 is formed by a predetermined rubber-like elastic body, and is formed as a block shape which approximately has the same shape and the same magnitude as a volumetric capacity shape of the grommet installation portion 13 for sealing the grommet installation portion 13 serving as the insertion port by being closely installed thereto. In the illustrated embodiment, since the grommet installation portion 13 is formed as a U-shaped form in its front surface as mentioned above, the grommet 21 is formed as a block shape which is provided with six surfaces constituted by a planate front surface 21a, a back surface 21b, a pair of right and left side surfaces 21c, an upper surface 21d and a curved bottom surface 21e in correspondence to the grommet installation portion 13. A through hole 22 for inserting the harness or the piping is provided in the center of a front surface of the grommet 21 so as to pass through in a grommet thickness direction. A sleeve 23 made of a rigid material for fitting the piping is installed to an inner peripheral surface of the through hole 22, however, the sleeve 23 may be omitted.

Further, one continuous seal projection 24 is provided in a surface facing to the inner surface 13c of the grommet installation portion 13 in the grommet 21, that is, a pair of right and left side surfaces and the curved bottom surface 21e so as to be positioned at the center in the grommet thickness direction, and the seal projection 24 is provided over a whole length in an arranging direction of three surfaces 21c and 21e. Therefore, one end portion 24a of the seal projection 24 is arranged in an upper side portion of one side surface 21c, and the other end portion 24a is arranged in an upper side portion of the other side surface 21c. As a result, the formation of the protruding portion 25 mentioned later is facilitated.

The seal projection 24 is compression deformed in the case that the seal projection is pressed to the inner surface 13c of the grommet installation portion 13, comes into close contact with the inner surface 13c of the grommet installation portion 13 on the basis of a reaction force generated at that time, and seals between the wall portion 12 and the grommet 21. Further, the seal projection 24 is compression deformed in the case that the seal projection is pressed to the inner surface 13c of the grommet installation portion 13, and the end portion 24a protrudes upward from the upper surfaces 12a and 21d of the wall portion 12 and the grommet 21 as shown in FIG. 18A at that time, thereby forming the protruding portion 25. In order to securely form the protruding portion 25, it is preferable to carry out an installing work from a direction which is opposite to a protruding direction of the protruding portion 25 in the case that the grommet 21 is installed to the grommet installation portion 13, and this direction is the same direction as a direction in which the cover 31 is put on the casing 11 (in other words, the grommet 21 is installed to the grommet installation portion 13 from the above in place of back and front sides in FIG. 13).

The rubber single body gasket 241 is structured such as to be interposed between the wall portion 12 of the casing 11 and the grommet 21, and the cover 31, and is previously installed to a gasket installation groove 32 which is provided in the cover 31.

Further, the rubber single body gasket 241 is formed as an O-ring shape having a circular cross section as shown in FIGS. 15A and 15B, a gasket single portion 242 and branch portions 243 obtained by branching the gasket single portion 242 into two sections and having a Y-shaped plane are integrally provided in a portion facing to the wall portion 12 at the installing time in a gasket longitudinal direction, and gasket double portions 244 continuously arranged from the branch portions 243 are integrally provided in a portion facing to the grommet 21. Further, since the branch portions 243 provided in the surface facing to the wall portion 12 are respectively provided in both sides while sandwiching the portion facing to the grommet 21 therebetween, and are provided so as to be opposed to each other, the gasket double portions 244 are provided so as to connect a pair of branch portions 243. Accordingly, a portion surrounded by a pair of branch portions 243 and the gasket double portions 244 is formed as a space portion 245 which passes through in a gasket height direction. Since the rubber single body gasket 241 is structured such as to seal between the wall portion 12 of the casing 11 and the cover 31 over a whole periphery, the rubber single body gasket is formed as an endless shape while being provided with the same plane shape as a plane shape of the wall portion 12 as shown in FIG. 15A. As a result, the gasket installation groove 32 to which the rubber single body gasket 241 is installed is also formed as an endless shape in the same manner, however, in a portion to which the gasket double portions 244 are installed, two grooves are provided as shown in FIG. 15C or a groove width is enlarged as shown in FIG. 15D.

Figure 15D:
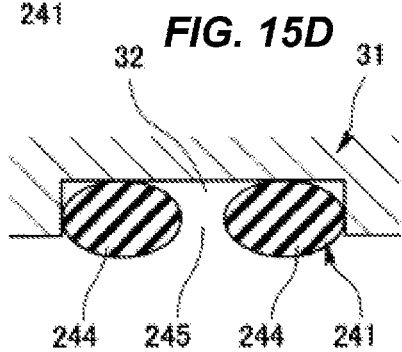
FIG. 15D is a cross sectional view of a substantial part and shows the other example of the grommet installation groove.

The rubber single body gasket 241 is installed to the gasket installation groove 32 as shown in FIGS. 15B, 15C and 15D, and is pinched in the state. Accordingly, as shown in FIG. 19A, one seal line 51 constructed by the gasket single portion 242 and branch portion lines S2 constructed by the branch portions 243 and having a Y-shaped plane are formed in a surface facing to the wall portion 12 in a lower surface of the rubber single body gasket 241, and two seal lines S3 constructed by the gasket double portions 244 are formed in a surface facing to the grommet 21, at the pinching time. Further, they are continuously provided as illustrated. Further, the space portion 245 is surrounded by the branch portion lines S2 and two seal lines S3. Therefore, the space portion 245 is finite in the gasket longitudinal direction, and the end portions in the longitudinal direction are arranged so as to face to the wall portion 12 in place of the grommet 21, and the protruding portion 25 constructed by the seal projection 24 is accordingly arranged just inside the branch portion 243 within the space portion 245. Further, a plane shape of the end portions in the longitudinal direction of the space portion 245 is formed as a V-shaped plane narrowing forward in connection with the Y-shaped plane of the plane shape in the branch portion 243.

In the case that the seal structure having the constructing elements is assembled, and the grommet 21 and the rubber single body gasket 241 are pinched in a vertical direction between the casing 11 and the cover 31, the seal projection 24 provided in a thickness surface of the grommet 21 (a pair of right and left side surfaces 21c and the bottom surface 21e) comes into close contact with the inner surface 13c of the grommet installation portion 13. As a result, the wall portion 12 of the casing 11 and the grommet 21 are sealed therebetween. The grommet 21 and the rubber single body gasket 241, the wall portion 12 of the casing 11 and the rubber single body gasket 241, and the rubber single body gasket 241 and the cover 31 are respectively sealed therebetween on the basis of the close contact by the pinching.

Further, since a position where respective surfaces of the wall portion 12 of the casing 11, the grommet 21 and the rubber single body gasket 241 intersect is formed as a section where three surfaces are joined together, there is fear that a gap is generated in the corner portion, however, in the seal structure having the structure mentioned above, the protruding portion 25 is formed in the end portion of the seal projection 24, and the protruding portion 25 is closely compressed within the space portion 245 in the rubber single body gasket 241 at the pinching time, as shown in FIGS. 18A and 18B. As a result, since the protruding portion 25 securely comes into contact with the rubber single body gasket 241, a gap is not generated.

Further, in the embodiment according to the present invention, since the branch portion 243 having the Y-shaped plane is provided in the rubber single body gasket 241, and the branch portion 243 is structured such as to compress the protruding portion 25 of the seal projection 24 in its inner side, the bifurcated branch portion 243 presses the protruding portion 25 toward the center in a grommet width direction on the basis of the application of the pinching force (since the protruding portion 25 is pressed to the end portion in the longitudinal direction of the space portion 245 having the V-shaped plane, the protruding portion 25 is pressed toward the center in the grommet width direction (a lateral direction in FIG. 19A) by the branch portion 144 as shown by an arrow M in FIG. 19A). Therefore, since a reaction force to the pressing force (a reaction force toward the end portion in the grommet width direction) is generated in the protruding portion 25, it is possible to further effectively inhibit the gap from being formed.

Accordingly, since the gap is not generated in the corner portion of the section where three surfaces are joined together, and a sealing performance can be secured over a whole periphery of the thickness surface of the grommet 21, it is possible to provide the three-surface seal structure which can achieve an excellent sealing performance.

With regard to the seal projection 24, the seal projection 24 is continuously provided in a pair of right and left side surfaces 21c and the bottom surface 21e in the thickness surface of the grommet 21 in the embodiment mentioned above, however, the seal projection 24 may be continuously provided in the upper surface 21d in addition to a pair of right and left side surfaces 21c and the bottom surface 21e. In this case, since a position where the seal projection provided in the side surfaces 21c and the seal projection provided in the upper surface 21d intersect protrudes further upward from the seal projection provided in the upper surface 21d at the pinching time, this position is utilized as the protruding portion 25.

Figure 14D:
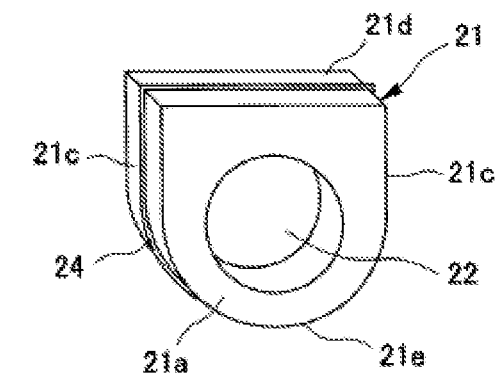
FIG. 14D is a perspective view showing the other example of the grommet.

As an example of this, in FIG. 14D, the seal projection 24 is continuously provided in the upper surface 21d in addition to a pair of right and left side surfaces 21c and the bottom surface 21e, and the seal projection 24 is provided as an endless shaped structure over a whole periphery of the thickness surface of the grommet 21 (a pair of right and left side surfaces 21c, the bottom surface 21e and the upper surface 21d).

Further, in the embodiment mentioned above, the rubber single body gasket 241 is constructed by the O-ring shape having the circular cross section, however, a shape (a cross sectional shape and/or a plane shape) of the rubber single body gasket 241 is not particularly limited, but may employ, for example, the following shapes.

Figure 16:
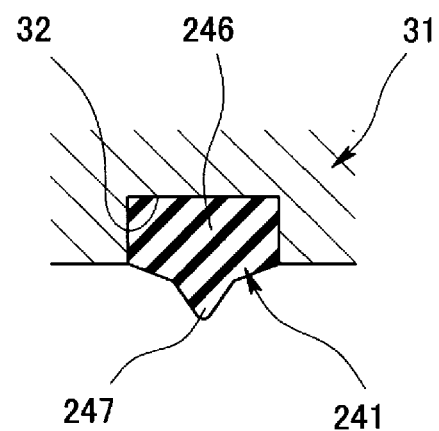
FIG. 16 is a cross sectional view of a substantial part and shows the other example of the rubber single body gasket.

In a gasket 241 shown in FIG. 16, an attaching portion 246 having a rectangular cross sectional shape is provided, and the attaching portion 246 is bifurcated in a part in the gasket longitudinal direction. As a result, the gasket single portion 242, a pair of branch portions 243, the gasket double portions 244 and the space portion 245 are formed. Further, a seal lip 247 for enhancing a seal surface pressure is provided in a lower surface of the attaching portion 246.

In a gasket 241 shown in FIGS. 17A, 17B and 17C, an attaching portion having a rectangular cross sectional shape is provided, a seal lip 247 is provided in a lower surface of the attaching portion 246, and the seal lip 247 is bifurcated in a part in the gasket longitudinal direction. As a result, the one seal line S1, the branch portion lines S2 and two seal lines S3 are formed, and a closed-end concave portion 248 is formed in place of the space portion 245 (the attaching portion 246 is formed one over its whole length (whole periphery), and only the seal lip 247 is bifurcated in a part in the gasket longitudinal direction).

Figure 19B:
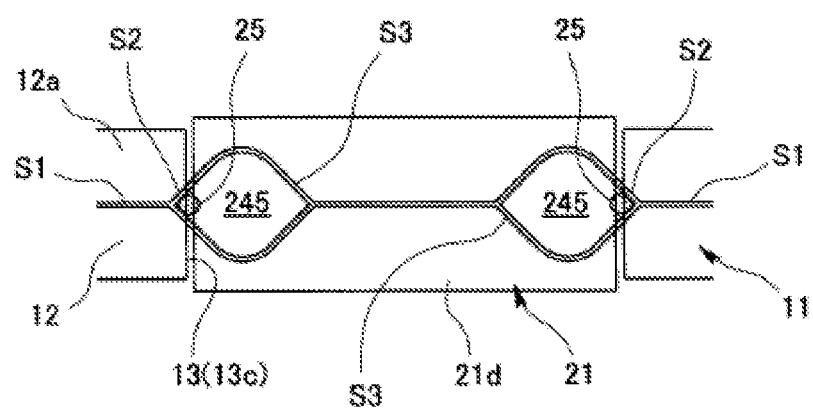
FIG. 19B is an explanatory view (a plan view) showing the other example of the layout of seal lines in the seal structure.

Further, in the embodiment mentioned above, with regard to the rubber single body gasket 241, the gasket double portions 244 continuously provided from the branch portions 243 are arranged in the surface facing to the grommet 21, and two seal lines S3 are formed by the gasket double portions 244, however, the gasket double portions 244 and two seal lines S3 may be converged into one within the surface facing to the grommet 21 as shown in FIG. 19B. In this case, the space portion 245 (or the concave portion 248) housing the protruding portion 25 is set at two positions in the gasket longitudinal direction.

What is claimed is:

1. A seal structure comprising:
a casing which is provided in its wall portion with a notch-like grommet installation portion;
a grommet which is installed to said grommet installation portion;
a cover which is put on said wall portion and the grommet; and
a metal base plate gasket which is installed between said wall portion and the grommet, and said cover,
wherein said grommet is provided with a seal projection at least on a surface which faces to an inner surface of said grommet installation portion,
wherein said seal projection seals between said wall portion and the grommet by coming into close contact with the inner surface of said grommet installation portion, and is provided with a protruding portion generated by a protrusion of a part of said seal projection toward said metal base plate gasket in the case that the seal projection comes into close contact with the inner surface of said grommet installation portion, wherein said metal base plate gasket is provided with two seal lines which are parallel to each other, the two seal lines being provided on a surface that faces toward said wall portion and continuously extend to face said grommet, and is further provided with a groove-like concave portion between said two seal lines, wherein the protruding portion in said seal projection is closely compressed within the groove-like concave portion in said metal base plate gasket, wherein said grommet installation portion is provided with a chamfer portion at an edge of the inner surface, and wherein said seal projection is enlarged little by little to correspond to a shape of said chamfer portion.

* * * * *